(12) United States Patent
Hakko

(10) Patent No.: US 7,927,773 B2
(45) Date of Patent: Apr. 19, 2011

(54) MEMORY MEDIUM STORING ORIGINAL DATA GENERATION PROGRAM, MEMORY MEDIUM STORING ILLUMINATION CONDITION DETERMINATION PROGRAM, ORIGINAL DATA GENERATION METHOD, ILLUMINATION CONDITION DETERMINATION METHOD, AND DEVICE MANUFACTURING METHOD

(75) Inventor: Manabu Hakko, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 196 days.

(21) Appl. No.: 12/420,571

(22) Filed: Apr. 8, 2009

(65) Prior Publication Data

US 2009/0258305 A1  Oct. 15, 2009

(30) Foreign Application Priority Data

Apr. 10, 2008  (JP) .................. 2008-102559

(51) Int. Cl.
*G03F 9/00* (2006.01)
(52) U.S. Cl. ................. 430/30; 430/5; 716/53
(58) Field of Classification Search ................ 430/5, 30; 716/53

See application file for complete search history.

(56) References Cited

U.S. PATENT DOCUMENTS 5,682,323 A * 10/1997 Pasch et al. ............... 716/53
2002/0152452 A1 * 10/2002 Socha ...................... 716/21

FOREIGN PATENT DOCUMENTS

| EP | 1439420 A | 7/2004 |
| JP | 2004-221594 A | 8/2004 |
| KR | 10-2006-0108233 A | 10/2006 |
| KR | 10-2007-0113874 A | 11/2007 |

* cited by examiner

*Primary Examiner* — Christopher G Young
(74) *Attorney, Agent, or Firm* — Canon USA Inc IP Division

(57) ABSTRACT

A memory medium stores a program for generating data on an original pattern used in an exposure apparatus forming an image of a target pattern on a substrate, the program comprising a determination step of determining a final assist pattern based on a light intensity distribution formed by a projection optical system when, of a main pattern and an assist pattern to accompany the main pattern which form the original pattern, only the assist pattern is inserted in an object plane of the projection optical system, and a combining step of combining the final assist pattern and the main pattern to generate data on the original pattern, wherein in the determination step, the final assist pattern is determined by repeating a process of calculating and evaluating the light intensity distribution, and a process of changing the assist pattern to be inserted in the object plane of the projection optical system.

11 Claims, 26 Drawing Sheets

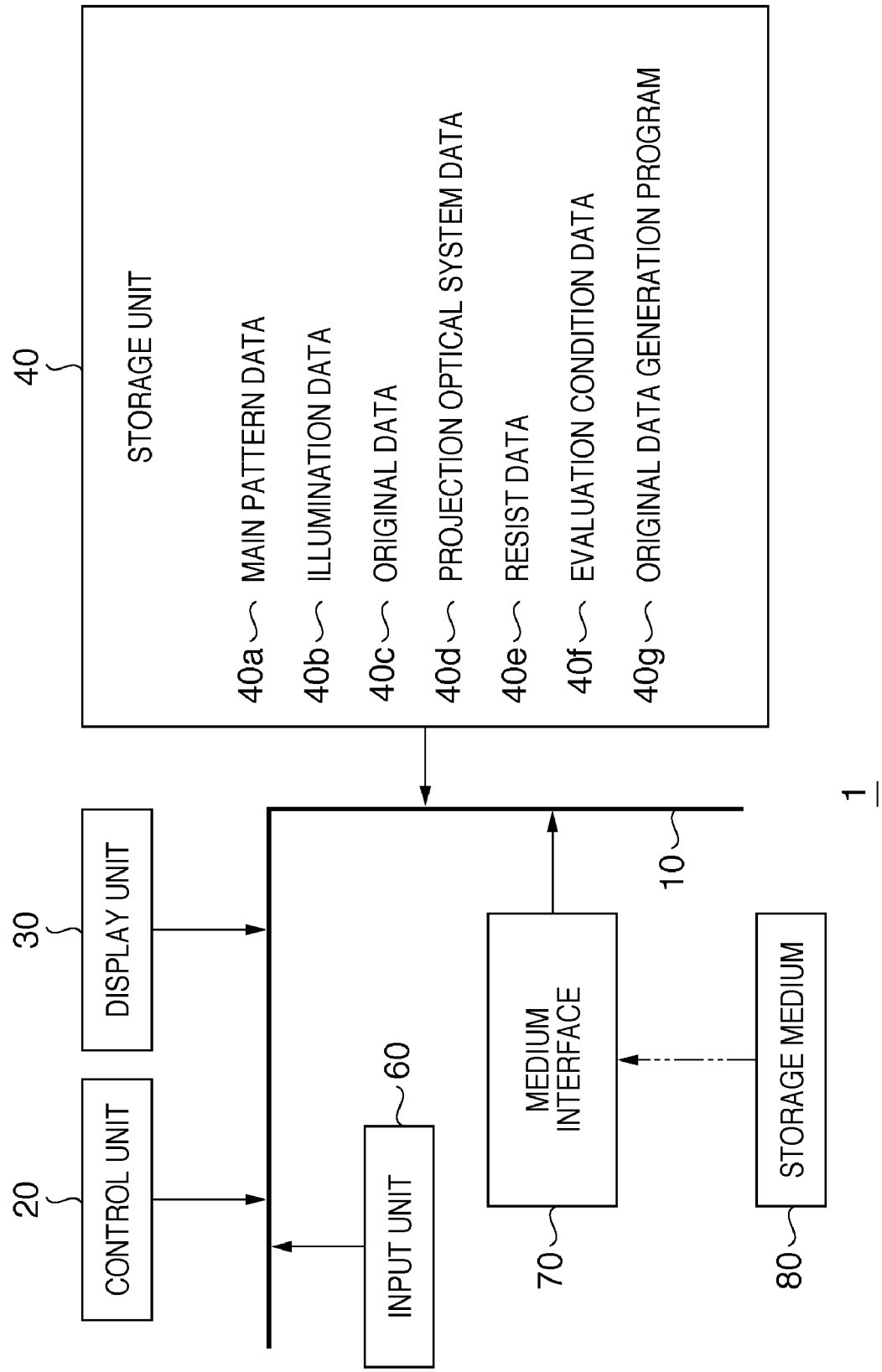

FIG. 3A  FIG. 3B  FIG. 3C
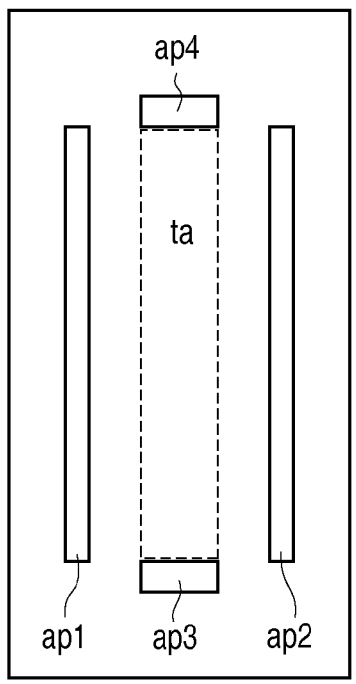
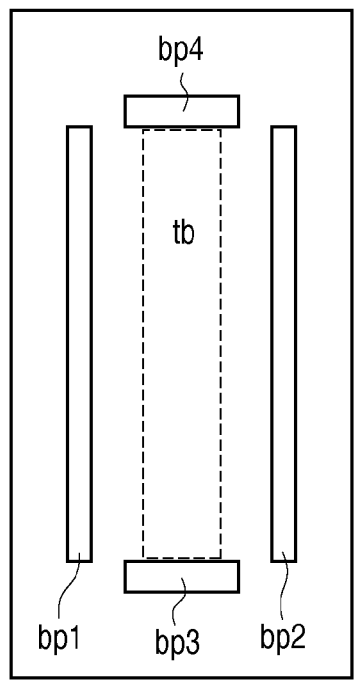
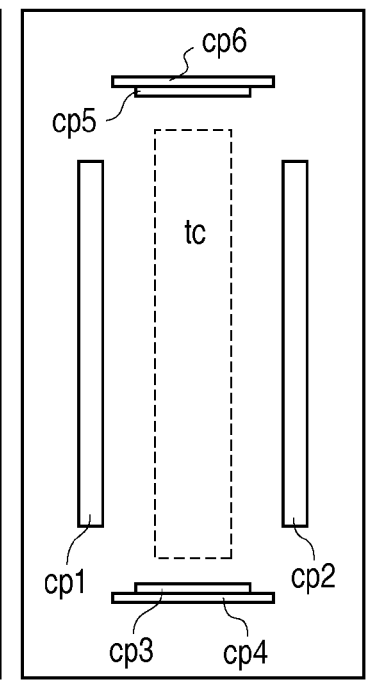
FIG. 3D  FIG. 3E
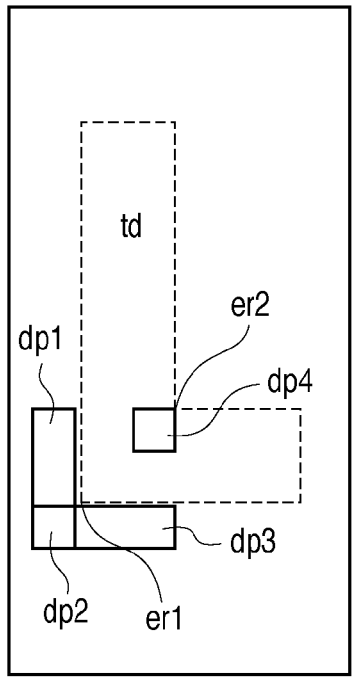
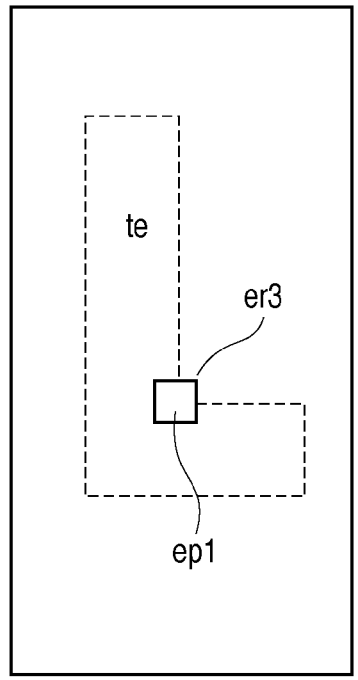

FIG. 6A
EFFECTIVE LIGHT SOURCE
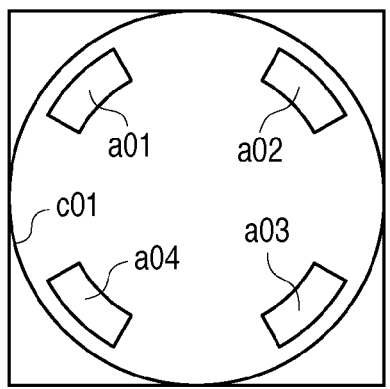
FIG. 6B
MAIN PATTERN
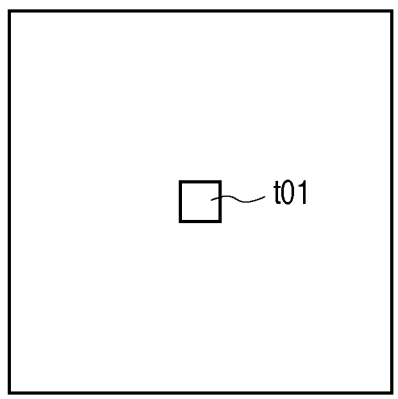
FIG. 7A
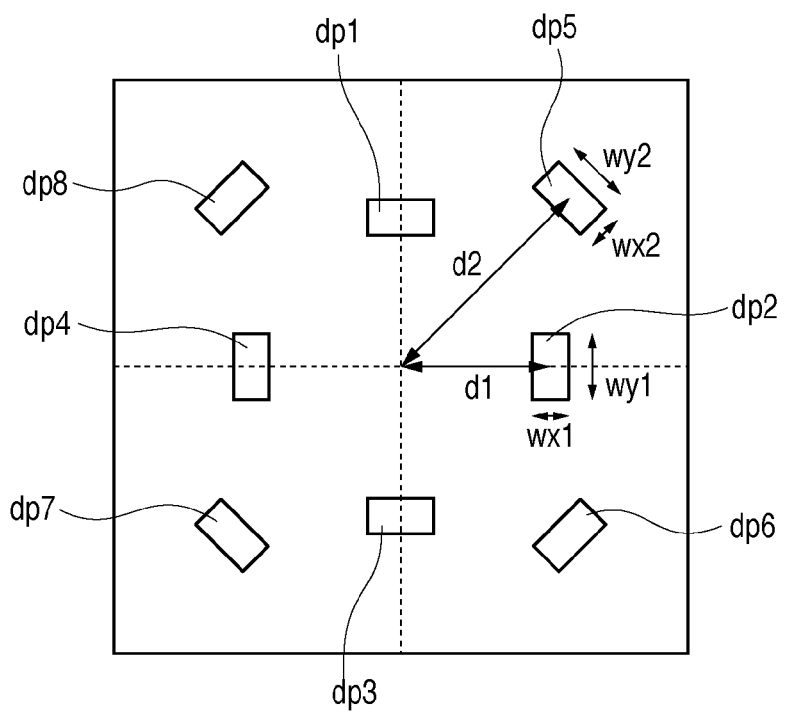
FIG. 7B
|  | d1 | d2 | wx1 | wy1 | wx2 | wy2 |
|---|---|---|---|---|---|---|
| ASSIST PATTERN A | 285 | 453 | 70 | 120 | 70 | 120 |
| ASSIST PATTERN B | 255 | 470 | 80 | 140 | 70 | 160 |

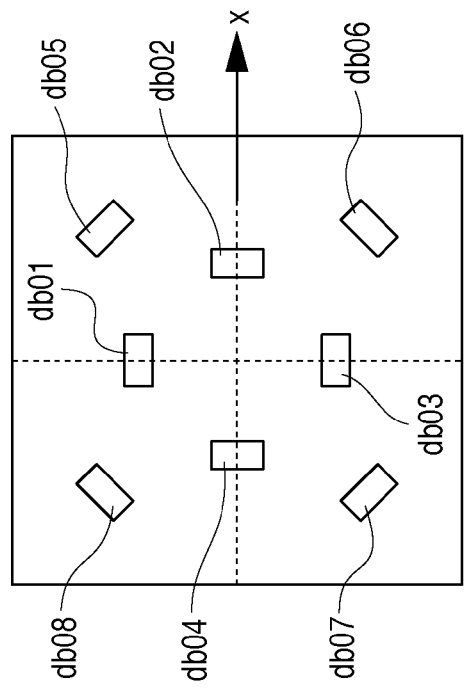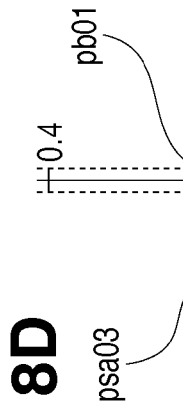
FIG. 8A
ASSIST PATTERN A
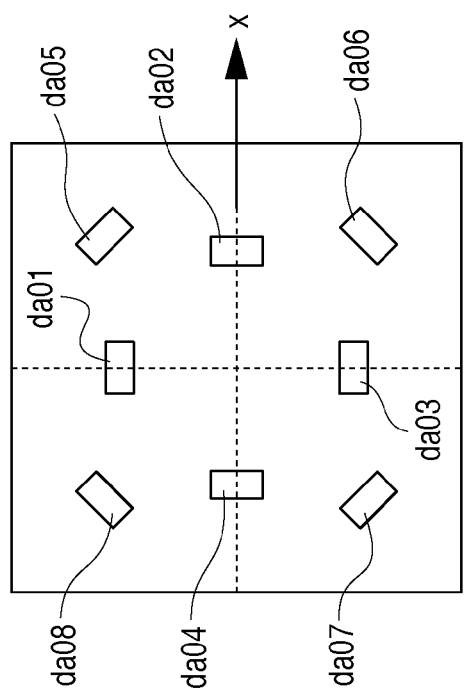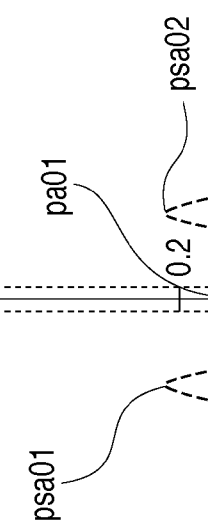
FIG. 8B
ASSIST PATTERN B
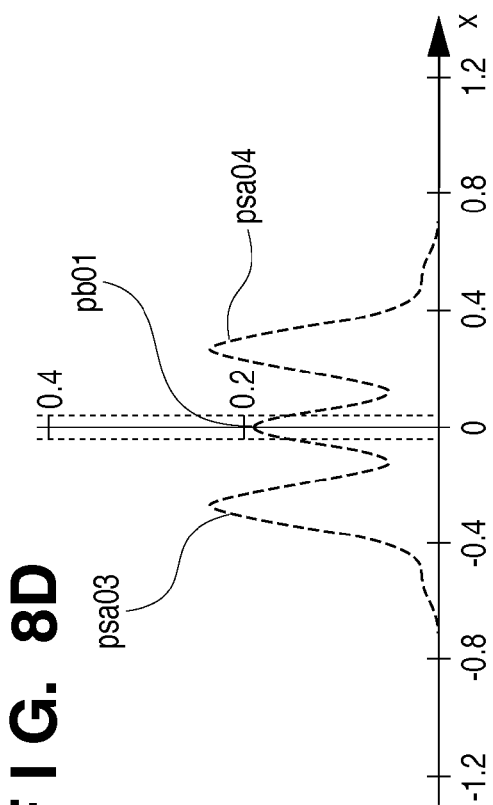
FIG. 8C
FIG. 8D

ASSIST PATTERN A

ASSIST PATTERN B

FIG. 12A
MAIN PATTERN + ASSIST PATTERN A
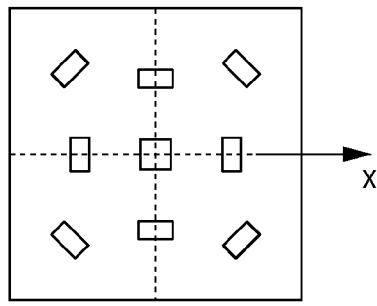
FIG. 12B
MAIN PATTERN + ASSIST PATTERN B
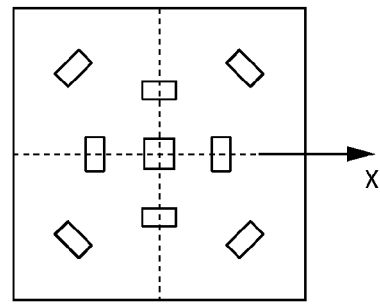
FIG. 12C
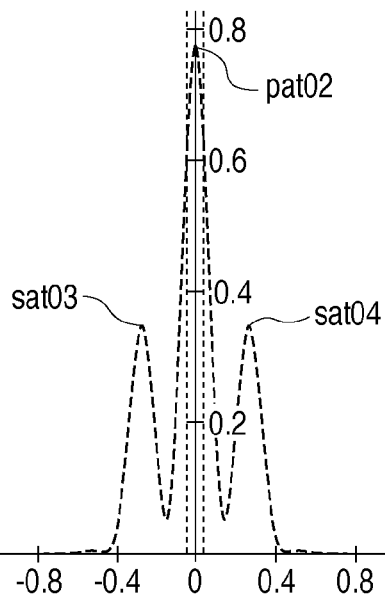
FIG. 12D
FIG. 12E
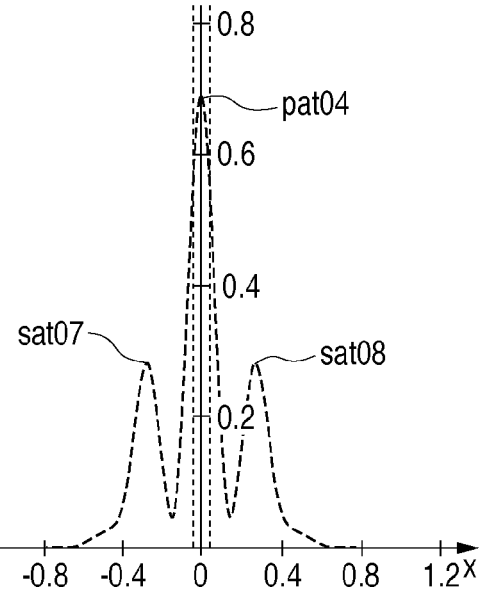
FIG. 12F FIG. 13A
EFFECTIVE LIGHT SOURCE
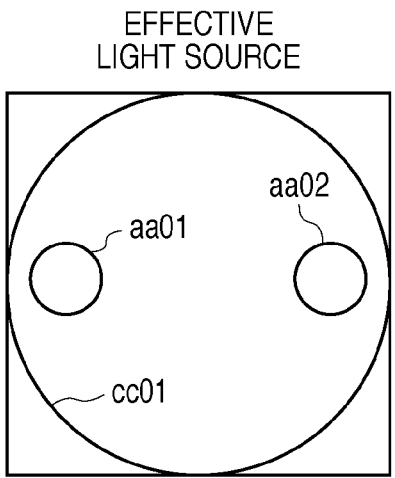
FIG. 13B
MAIN PATTERN
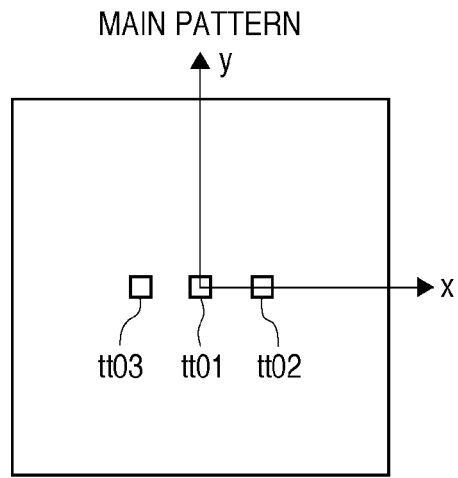
FIG. 14A
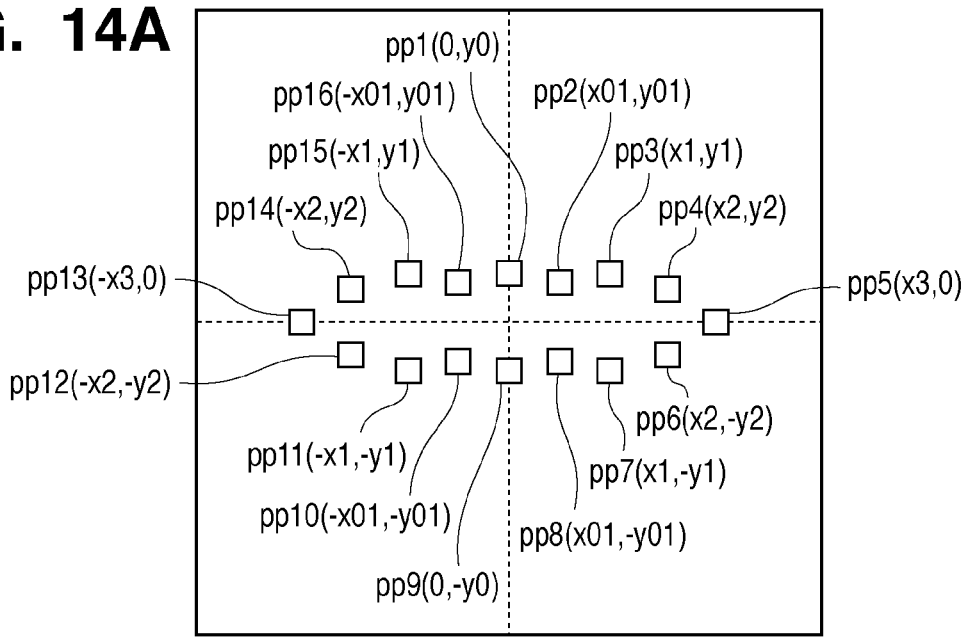
FIG. 14B
|  | y0 | x01 | y01 | x1 | y1 | x2 | y2 | x3 |
|---|---|---|---|---|---|---|---|---|
| ASSIST PATTERN AA | 171 | 179 | 140 | 357 | 170 | 557 | 113 | 730 |
| ASSIST PATTERN BB | 171 | 179 | 190 | 360 | 180 | 575 | 125 | 760 |

ASSIST PATTERN AA

ASSIST PATTERN BB

MAIN PATTERN + ASSIST PATTERN AA

MAIN PATTERN + ASSIST PATTERN BB

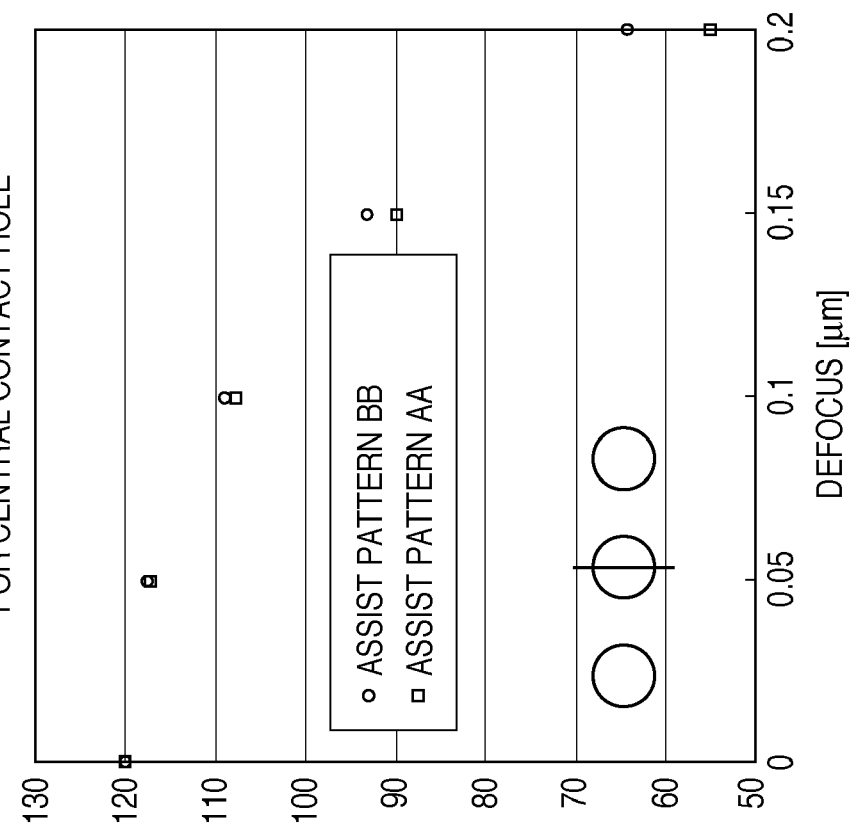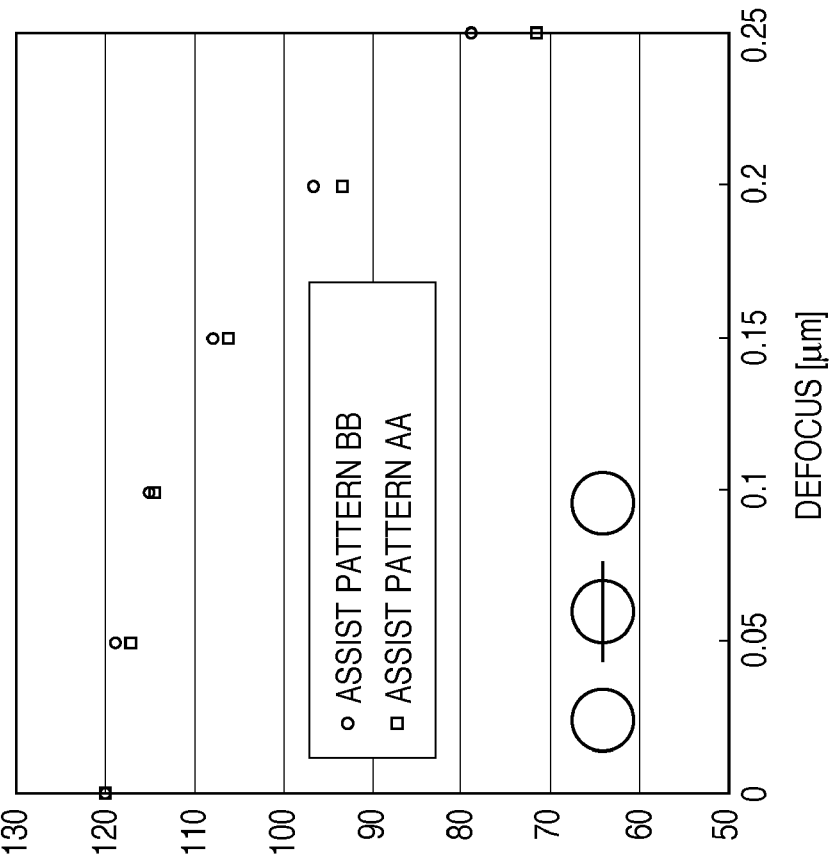

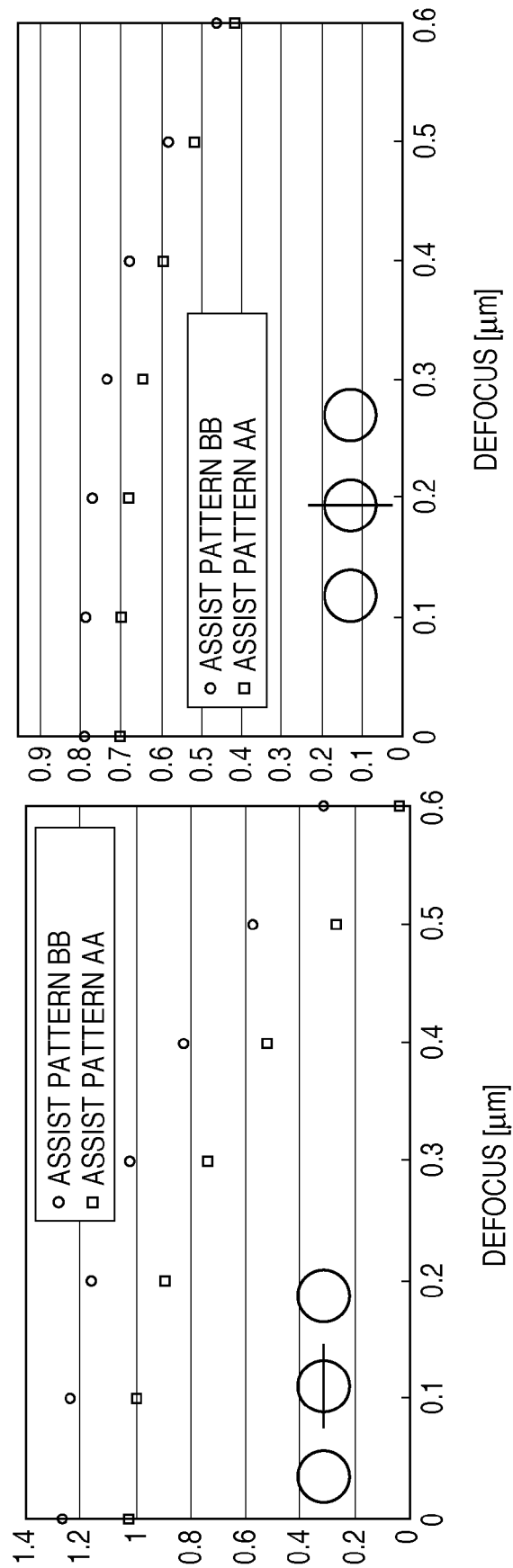

EFFECTIVE
LIGHT SOURCE

MAIN PATTERN

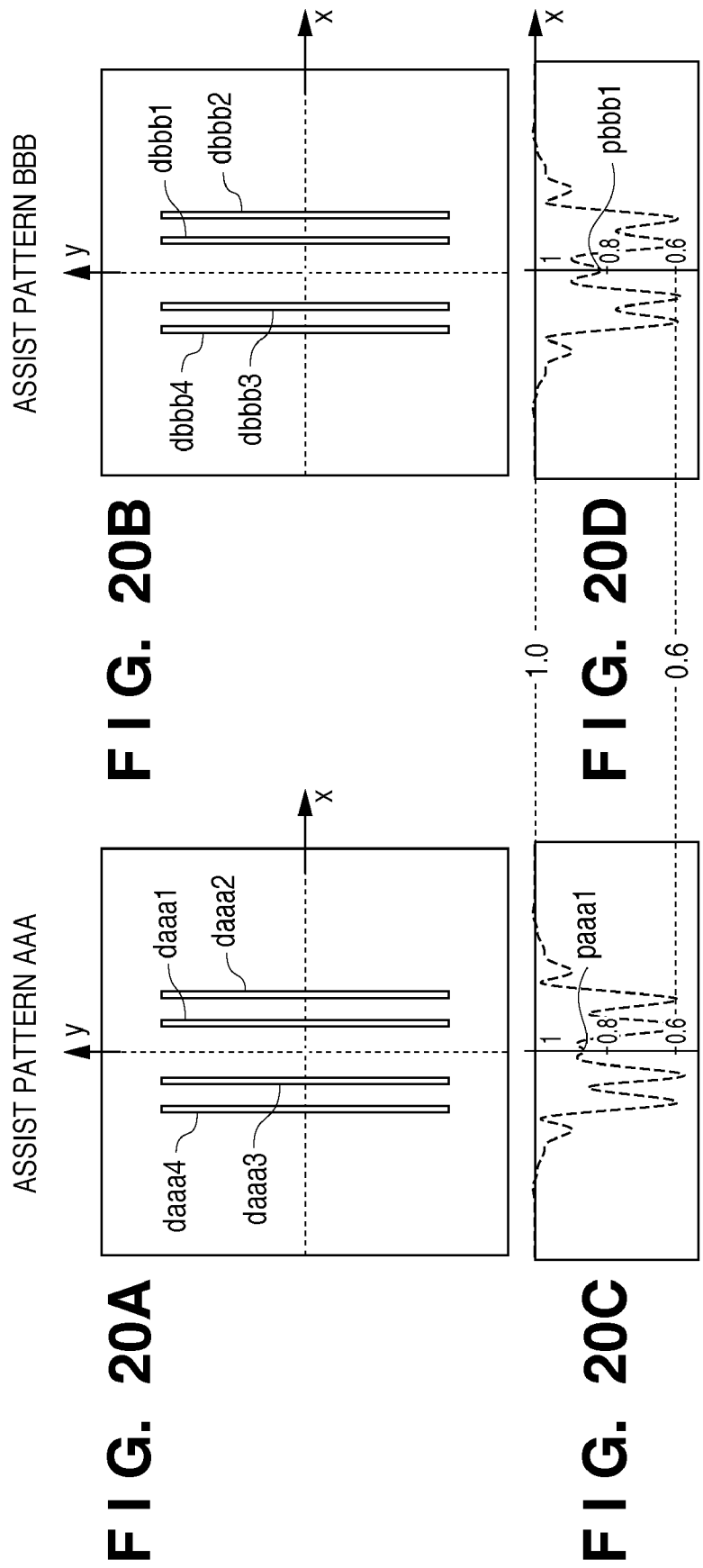

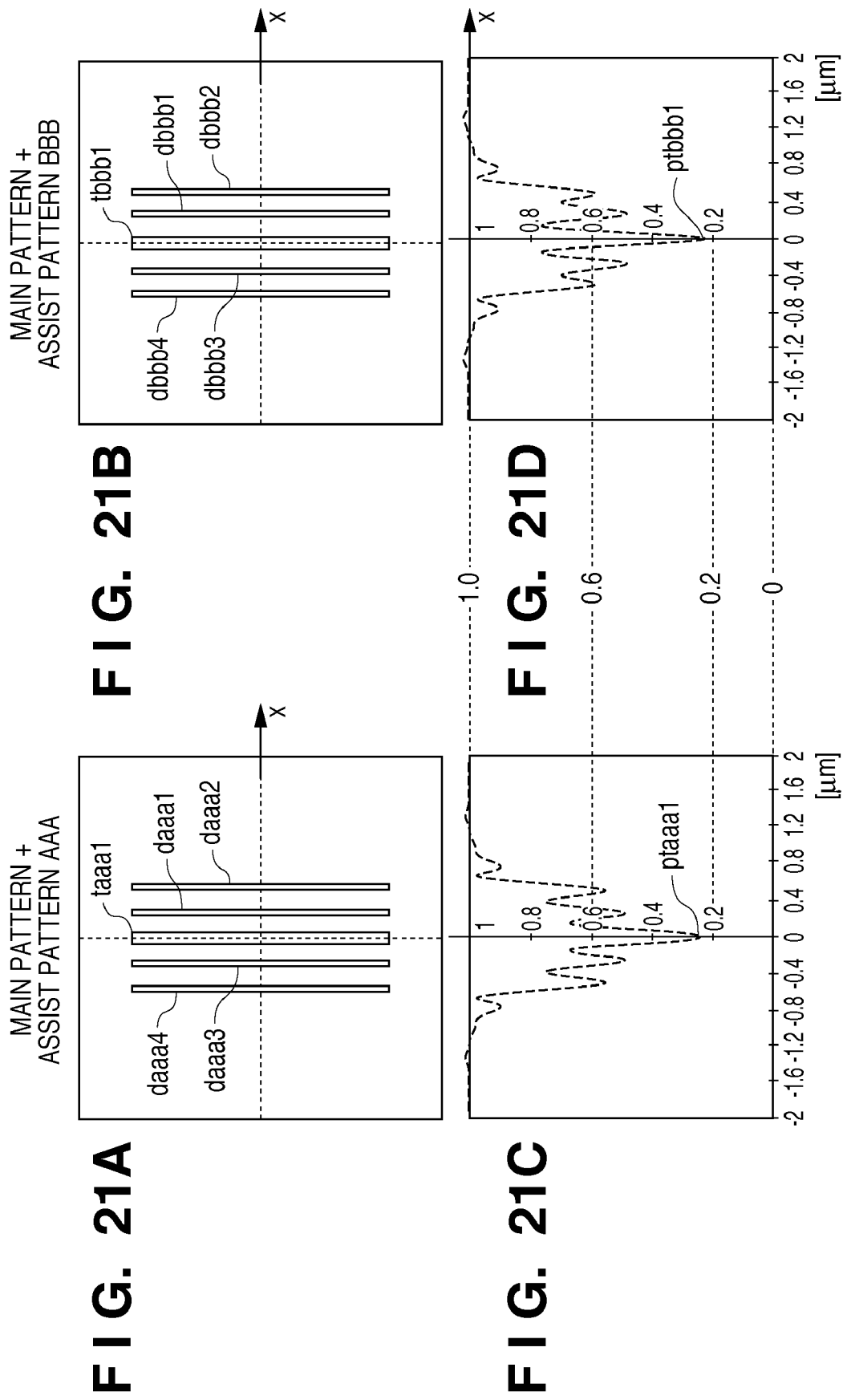

FIG. 23A
ASSIST PATTERN BBB
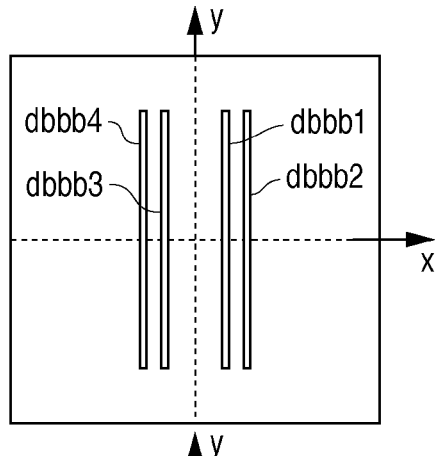
FIG. 23B
ASSIST PATTERN CCC
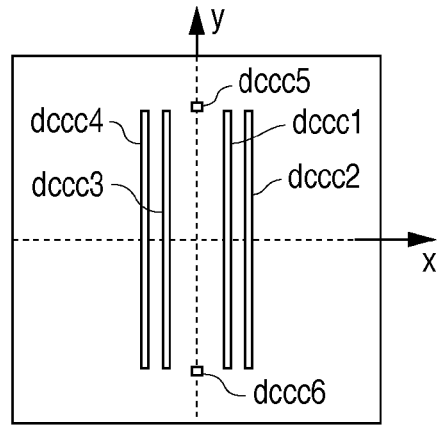
FIG. 23C
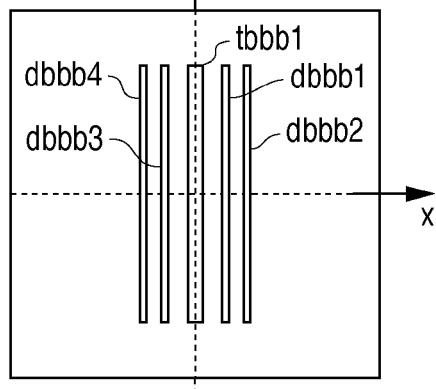
FIG. 23D
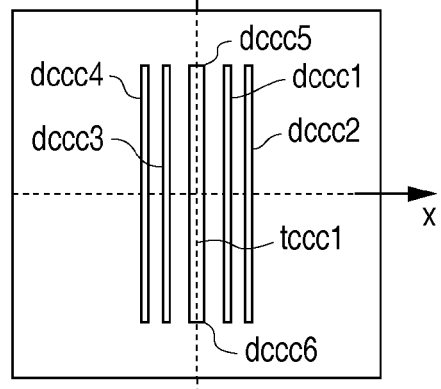
FIG. 23E
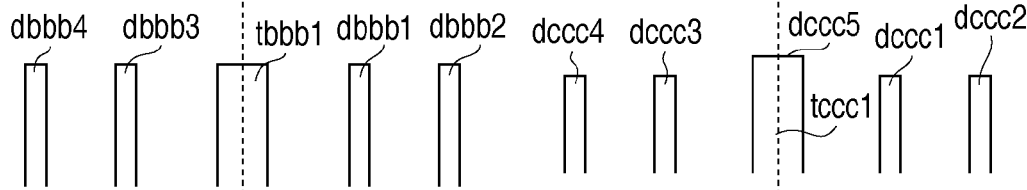
FIG. 23F
FIG. 23G
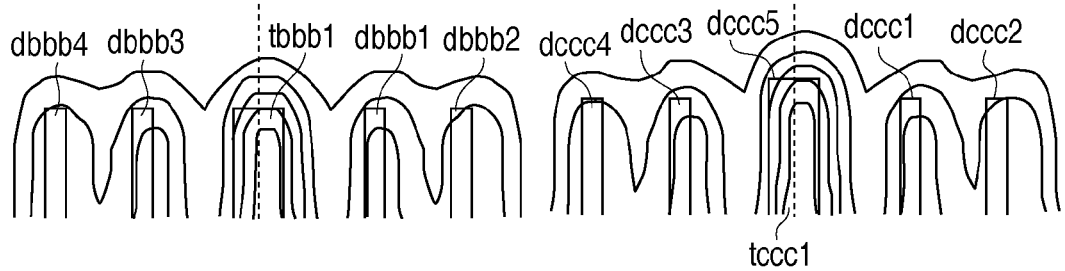
FIG. 23H FIG. 25A
ILLUMINATION CONDITION a
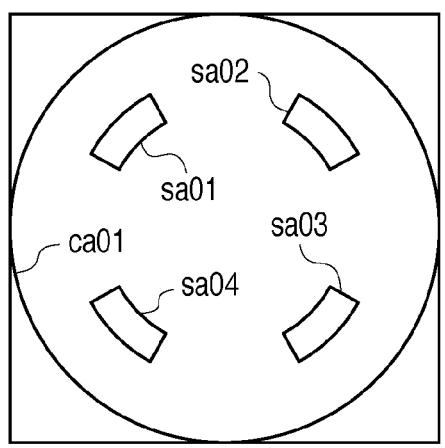
FIG. 25B
ILLUMINATION CONDITION b
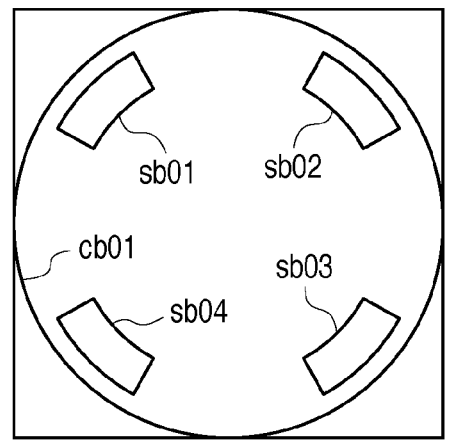
FIG. 25C
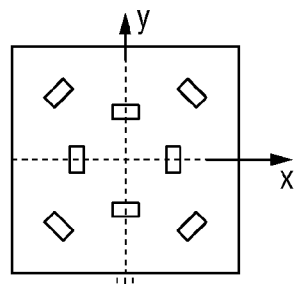
FIG. 25D
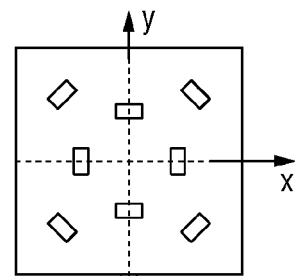
FIG. 25E
FIG. 25F
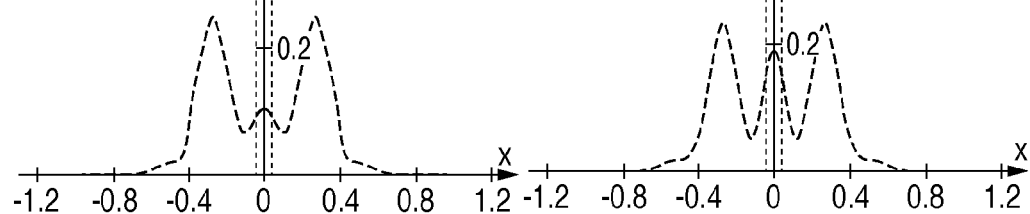

MEMORY MEDIUM STORING ORIGINAL DATA GENERATION PROGRAM, MEMORY MEDIUM STORING ILLUMINATION CONDITION DETERMINATION PROGRAM, ORIGINAL DATA GENERATION METHOD, ILLUMINATION CONDITION DETERMINATION METHOD, AND DEVICE MANUFACTURING METHOD

BACKGROUND OF THE INVENTION

1. Field of the Invention

The present invention relates to a memory medium storing an original date generation program, a memory medium storing an illumination condition determination program, an original data generation method, an illumination condition determination method, and a device manufacturing method.

2. Description of the Related Art

An exposure apparatus which projects a circuit pattern formed on an original (also called a reticle or a mask) onto a substrate such as a wafer by a projection optical system to expose the substrate is used in lithography. A method of increasing the numerical aperture (NA) of the projection optical system, a method of shortening the exposure wavelength $\lambda$, and a method of decreasing the k1 factor are known as methods of improving the resolution of the exposure apparatus.

In a typical approach to the method of decreasing the k1 factor, an assist pattern having a size small enough not to resolve it or enough to suppress its resolution is added onto an original on which a pattern to be transferred is formed. The assist pattern is also often called an assist form, assist feature, light intensity adjustment pattern, scattering bar, diffractive bar, assist bar, assist pattern, dummy pattern, correction pattern, dummy, or the like.

Japanese Patent Laid-Open No. 2004-221594 describes, as a problem to be solved, the fact that any optimization method and modeling method which determine an optimum position of an assist pattern on an original have not yet been developed. Japanese Patent Laid-Open No. 2004-221594 proposes a method of generating an interference map based on a TCC (Transmission Cross Coefficient) and an impulse function describing a resolvable feature on the original, and adding an assist pattern onto the original. Unfortunately, the generation of an interference map requires a large amount of calculation because TCC calculation is necessary, resulting in increases in the calculation time and in the required capacity of a computer memory.

SUMMARY OF THE INVENTION

The present invention provides calculating an original pattern which can obtain a higher imaging performance with a lower load, or calculating an original illumination condition which can obtain a higher imaging performance with a lower load.

One aspect of the present invention provides a memory medium storing an original data generation program for generating data on an original pattern used in an exposure apparatus which projects the original pattern onto a substrate via a projection optical system to form an image of a target pattern on the substrate, the program comprising a determination step of determining a final assist pattern based on a light intensity distribution formed by the projection optical system when, of a main pattern and an assist pattern to accompany the main pattern which form the original pattern, only the assist pattern is inserted in an object plane of the projection optical system, and a combining step of combining the final assist pattern and the main pattern to generate data on the original pattern, wherein in the determination step, the final assist pattern is determined by repeating a process of calculating and evaluating the light intensity distribution, and a process of changing the assist pattern to be inserted in the object plane of the projection optical system.

Another aspect of the present invention provides a memory medium storing an illumination condition determination program for determining an illumination condition under which an original pattern is illuminated in an exposure apparatus which projects the original pattern onto a substrate via a projection optical system to form an image of a target pattern on the substrate, the program comprising a determination step of determining a final illumination condition based on a light intensity distribution formed by the projection optical system when, of a main pattern and an assist pattern accompanying the main pattern which form the original pattern, only the assist pattern is inserted in an object plane of the projection optical system, wherein in the determination step, the final illumination condition is determined by repeating a process of calculating and evaluating the light intensity distribution, and a process of changing the illumination condition.

Further features of the present invention will become apparent from the following description of exemplary embodiments with reference to the attached drawings.

BRIEF DESCRIPTION OF THE DRAWINGS

FIG. 2 is a block diagram schematically showing the configuration of a computer for executing an original data generation program according to a preferred embodiment of the present invention;

FIGS. 3A to 3E are views each illustrating an original pattern including a main pattern and assist patterns accompanying it;

FIGS. 6A and 6B are views exemplifying an effective light source and a main pattern, respectively;

FIG. 7A is a view illustrating an assist pattern;

FIG. 7B is a table illustrating the shapes and arrangements of assist patterns;

FIGS. 8A to 8D are views illustrating a change in the intensity distribution in response to a change made to the assist pattern;

FIGS. 12A to 12F are views illustrating changes in the intensity distributions in response to a change made to the assist pattern;

FIGS. 13A and 13B are views exemplifying an effective light source and a main pattern, respectively;

FIG. 14A is a view illustrating an assist pattern;

FIG. 14B is a table illustrating the shapes and arrangements of assist patterns;

FIGS. 17A and 17B are graphs illustrating the imaging performances of the assist patterns;

FIGS. 18A and 18B are graphs illustrating the imaging performances of the assist patterns;

FIGS. 20A to 20D are views illustrating a change in the intensity distribution in response to a change made to the assist pattern;

FIGS. 21A to 21D are views illustrating a change in the intensity distribution in response to a change made to the assist pattern;

FIGS. 23A to 23H are views illustrating changes in the intensity distributions in response to a change made to the assist pattern;

FIGS. 25A to 25F are views illustrating a change in the imaging performance in response to a change in the illumination condition;

DESCRIPTION OF THE EMBODIMENTS

Figure 1:
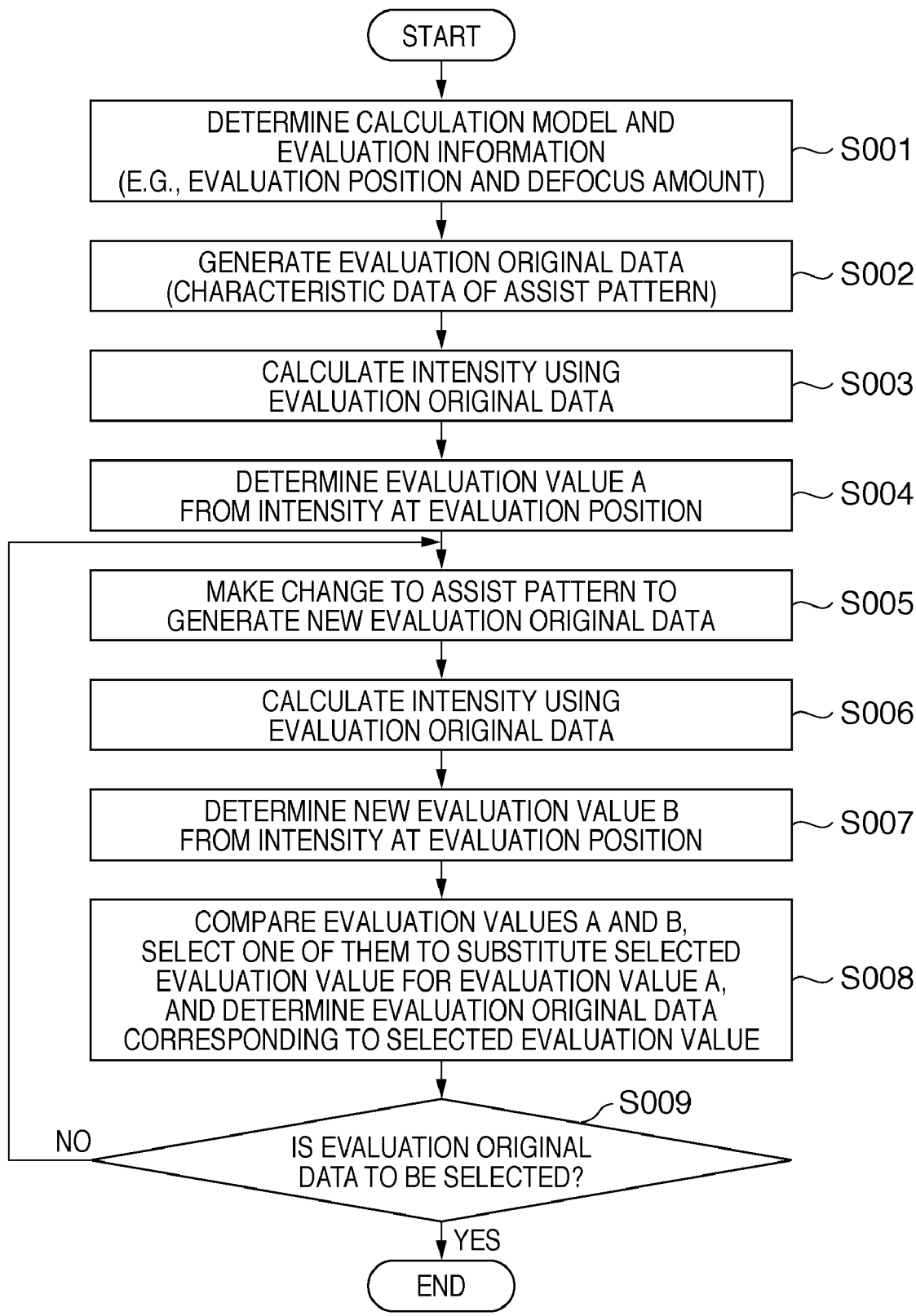
FIG. 1 is a flowchart schematically showing the sequence of an original data generation process by an original data generation program.

The present invention is especially useful for generating data on an original used in manufacturing micromechanics and various types of devices, e.g., semiconductor chips such as an IC and an LSI, display devices such as a liquid crystal panel, detection devices such as a magnetic head, and image sensing devices such as a CCD. The micromechanics mean herein micrometer-order sophisticated mechanical systems configured by applying technologies of manufacturing a semiconductor integrated circuit to the fabrication of a microstructure, and techniques of configuring these systems. The present invention is also applicable to, for example, so-called immersion exposure which fills the space between the final surface of a projection optical system and the surface of a substrate with a liquid, and forms a latent image on a photosensitive agent on the surface of the substrate via the projection optical system and the liquid.

The concept disclosed in the present invention can be modeled mathematically. Hence, the present invention can be implemented as a software function of a computer system. Note that a software function of a computer system includes programming including executable software codes, and can generate original data. The software codes can be executed by a general-purpose computer. Codes or associated data records are stored in a general-purpose computer platform during the software code operation. In other cases, the software codes are often stored in other sites or loaded into an appropriate general-purpose computer system. For this reason, the software codes can be held on at least one mechanical computer-readable recording medium as one or a plurality of modules.

The present invention will be described hereinafter in the form of the above-mentioned codes, and can function as one or a plurality of software products. The software codes are executed by the processor of the computer system. The computer platform can implement methods to be described in this specification and shown in embodiments, a catalog, or a software download function.

One aspect of the present invention takes advantage of the fact that the imaging performance improves by changing data on assist patterns (for example, the number, positions, sizes, shapes, transmittances, and phases of assist patterns). Using an evaluation value (for example, the light intensity at a set evaluation position) having a correlation with the imaging performance, the characteristics of data on assist patterns with a higher imaging performance are derived.

The present invention is applicable not only to a binary mask but also to a halftone mask. The halftone mask means herein a mask in which a semitransparent member is substituted for the light-shielding portion of a binary mask, and which has its opening portion 180° out of phase with its semitransparent portion. Also, the present invention is not limited to a transmission mask, and may be applied to a reflection mask.

In this specification, a latent image pattern obtained by slicing, at a set slice level, a light intensity distribution formed on a photosensitive agent on a substrate will be called a target pattern. Also, a pattern provided on an original in order to form the target pattern will be called an original pattern. The original pattern includes a main pattern similar to the target pattern, and an assist pattern accompanying it. The assist pattern means a pattern which remains after removing the main pattern from the original pattern. The main pattern can be called a layout pattern. Data on the original pattern is generated by an information processing apparatus (computer).

The assist pattern may be separated from, be in contact with, or overlap the main pattern to be accompanied by it. Reference numerals ap1, ap2, ap3, ap4, bp1, bp2, bp3, bp4, cp1, cp2, cp3, cp4, cp5, cp6, dp1, dp2, dp3, dp4, and ep1 in FIGS. 3A to 3E denote assist patterns. On the other hand, reference numerals ta, tb, tc, td, and te in FIGS. 3A to 3E denote main patterns. The assist patterns ap1 and ap2 are separated from the main pattern ta to be accompanied by them. The assist patterns ap3 and ap4 are in contact with the main pattern ta. In the original pattern, the assist patterns ap3 and ap4 are combined with the main pattern ta to be accompanied by them.

A combination of an assist pattern and a main pattern is assumed to be different from the main pattern. The assist patterns bp3 and bp4 are combined with the main pattern to form an original pattern having a so-called hammerhead shape. A pattern formed by combining the assist patterns cp5 and cp6 is not resolved.

FIG. 3D shows a case in which a positive resist is used. The assist patterns dp1, dp2, and dp3 which pass light are combined with the main pattern td so that the light intensity at an evaluation position er1 increases relative to that on the L-shaped main pattern td which passes light. The assist pattern dp4 which does not pass light is arranged so as to decrease the light intensity at an evaluation position er2.

If the assist pattern and the main pattern overlap each other, a shape obtained after removing the overlapping region from the assist pattern is assumed to be the shape of the assist pattern.

Referring to FIG. 3E, the main pattern te has the same shape as that of the main pattern td, and the assist pattern ep1 which does not pass light is arranged so as to decrease the light intensity at an evaluation position er3. In some cases, the vertex of the assist pattern may not be located on the contour of the main pattern, as in the assist pattern ep1.

The assist pattern is not limited to a single figure as in the assist pattern ap1 shown in FIG. 3A, and often means a set of a plurality of figures, such as an assist pattern A shown in FIG. 8A. In addition, the assist pattern means a pattern which is not resolved by itself. The size of the assist pattern is changed on an original data generation program (to be described later) within the range in which it is not resolved.

The size of the assist pattern is desirably determined such that a light intensity formed at the position of the main pattern by the interference effect of the assist pattern alone is about 20% to 40% that formed at the position of the main pattern by the interference effect of both the main pattern and the assist pattern.

FIG. 2 is a block diagram schematically showing the configuration of a computer (information processing apparatus) for executing an original data generation program according to a preferred embodiment of the present invention. A computer 1 includes a bus interconnection 10, control unit 20, display unit 30, storage unit 40, input unit 60, and medium interface 70. The control unit 20, display unit 30, storage unit 40, input unit 60, and medium interface 70 are connected to each other via the bus interconnection 10. The medium interface 70 is configured to be connectable to a recording medium 80.

The storage unit 40 stores main pattern data 40a, light source data 40b, original data 40c, projection optical system data 40d, resist data 40e, evaluation condition data 40f, and an original data generation program 40g. The main pattern data 40a is data on a main pattern similar to a target pattern to be formed on a substrate as the exposure target pattern body. The light source data 40b, original data 40c, projection optical system data 40d, resist data 40e, and evaluation condition data 40f are pieces of information concerning the light source, original, projection optical system, resist, and evaluation condition, respectively. The original data generation program 40g is executed by referring to these pieces of information.

The original data 40c includes data on an evaluation original pattern (to be described later). Details of this data will be explained, together with the original data generation program. The original data generation program 40g is a program for generating original data 40c, and includes a subprogram for determining data on assist patterns.

The control unit 20 is, for example, a CPU, GPU, DSP, or microcomputer, and can include a cache memory for temporary storage. The display unit 30 includes display devices such as a CRT display and liquid crystal display. The storage unit 40 includes memory devices such as a semiconductor memory and hard disk. The input unit 60 includes, for example, a keyboard and mouse. The medium interface 70 includes, for example, a drive for a medium such as a CD-ROM and a USB interface. The recording medium 80 includes, for example, a medium such as a CD-ROM and a recording medium such as a USB memory.

In one example of a method of executing the original data generation program 40g, the recording medium 80 which records the original data generation program 40g is connected to the medium interface 70, and the original data generation program 40g is installed on the computer. This installation includes storing a copy of the original data generation program 40g in the storage unit 40. The user inputs start-up instructions of the original data generation program 40g to the input unit 60. Upon receiving the start-up instructions of the original data generation program 40g, the control unit 20 refers to the storage unit 40 and starts up the original data generation program 40g based on the start-up instructions.

The sequence of an original data generation process by an original data generation program will be schematically explained with reference to FIG. 1. In step S001, in accordance with the information input by the user, a calculation model and evaluation information are determined from the data stored in the storage unit 40. The evaluation information includes the position at which the light intensity is calculated and the defocus amount.

In step S002, data on an evaluation original pattern (evaluation original data) is generated. The evaluation original data includes an assist pattern. The evaluation original data may include or may not include the main pattern in addition to the assist pattern.

In step S003, the light intensity on the image plane of the projection optical system (on the surface of the substrate) is calculated using the evaluation original data. At this time, a light intensity formed on the image plane of the projection optical system is calculated assuming that an evaluation original pattern specified by the evaluation original data is inserted in the object plane of the projection optical system. In step S004, an evaluation value A is determined based on the light intensity at the evaluation position.

In step S005, the evaluation original data is changed by changing the assist pattern.

In step S006, the light intensity distribution on the image plane of the projection optical system (on the surface of the substrate) is calculated using the changed evaluation original data. In step S007, an evaluation value B is determined based on the light intensity distribution calculated based on the changed evaluation original data.

In step S008, the two evaluation values A and B are compared, and one of the evaluation values A and B is selected as a new evaluation value A based on the comparison result. In addition, evaluation original data corresponding to the selected evaluation value is determined as the current evaluation original data.

In step S009, it is determined whether to select the current evaluation original data. If YES in step S009, the original data generation program is terminated. The evaluation original data is repeatedly changed until a more desirable evaluation value is obtained.

The original data generation process executed by the original data generation program will be explained in more detail next with reference to FIG. 4.

First, in step R01, various types of analysis conditions are determined in accordance with the information input by the user via the input unit 60. Step R01 can include, for example, sub-steps R101 to R105. In sub-step R101, a main pattern to evaluate the imaging performance is determined. In sub-step R102, illumination information including the illumination conditions under which the imaging performance is evaluated is determined. The illumination information can include pieces of information such as the effective light source shape, wavelength, polarization, phase, and light amount distribution as the illumination conditions.

In sub-step R103, original information serving as information concerning an original to evaluate the imaging performance is determined. The original information can include, for example, the refractive index and transmittance of an original. The original information can also include, e.g., phase information when the original is a phase shift mask. In sub-step R103, information concerning the evaluation original data obtained in step S110 upon the past calculation can be selected as the original information.

In sub-step R104, projection optical system information serving as information concerning a projection optical system of an exposure apparatus is determined. The projection optical system information can include, for example, information on the NA and aberration of a projection optical system.

In sub-step R105, resist information serving as information concerning a resist is determined. Note that information other than the pieces of information described herein may be determined and used, and some of the pieces of information described herein may be omitted without departing the spirit and scope of the present invention. The same applies to data and pieces of information to be described hereinafter.

In step R02, a condition concerning evaluation of the imaging performance is determined in accordance with the information input by the user via the input unit 60. Step R02 includes sub-steps R201 to R203. In sub-step R201, the defocus amount in calculating the light intensity is determined. The defocus amount may be set to a single value or a plurality of values. When a plurality of values are set, the evaluation values may be imaging performances (the CD and the NILS) shown in embodiments.

However, one merit of this method is that an assist pattern can be determined by a single defocus amount. For this reason, the amount of calculation is desirably suppressed by setting the defocus amount to a single value. Also, the defocus amount desirably has a nonzero value set from the depth of focus required for pattern formation. This is to improve the imaging performance by the effect of the assist pattern by preventing the imaging performance of a target pattern from deteriorating as the defocus amount increases, and details of this logic will be described in the first embodiment. That the defocus amount has a nonzero value amounts to evaluating a light intensity formed at a position misaligned from the image plane of the projection optical system.

The analysis of not a main pattern but only an assist pattern can be used not only in optimization of the assist pattern but also in evaluation of the assist pattern. In a mask pattern which passes light, an assist pattern which forms a relatively high intensity at the position of the main pattern by itself can be evaluated to be excellent. In contrast, in a mask pattern which shields light, an assist pattern which forms a relatively low intensity at the position of the main pattern can be evaluated to be excellent. In case of, for example, a linear main pattern, if an intensity formed by interference of an assist pattern alone is especially high at the line end, the assist pattern is determined to have an effect of preventing shortening of the line. The analysis of not a main pattern but only an assist pattern makes it possible to more sensitively evaluate the assist pattern than when the main pattern is present. When the main pattern is divided in order to divide one design into two originals in double exposure or two-time exposure, the boundary line of the division is preferably determined as the evaluation position. With this operation, an assist pattern which forms an especially high light intensity (that is formed only by the assist pattern) at the boundary line is selected. This makes it possible to prevent separation of a latent image pattern due to the division.

In sub-step R202, an intensity evaluation position is determined as the position at which the light intensity value obtained by calculation is evaluated. The light intensity is calculated for the defocus amount determined in sub-step R201. The intensity evaluation positions are er1 and er2 in FIG. 3D and er3 in FIG. 3E.

If the target pattern is a hole pattern such as a contact hole pattern, the evaluation position is preferably set at the center of the target pattern. If the target pattern is a line pattern, it is advantageous to set the evaluation position at a portion, at which the optical performance is more likely to deteriorate, such as the line end as a measure against shortening of the line. The number of evaluation positions is not limited to one, and a plurality of evaluation positions can be set. If a plurality of evaluation positions are set, the weighted sum of the light intensities at the respective positions may be determined as the evaluation value. In this case, the weighting factor data can be determined in sub-step R202. Also, the evaluation value is not limited to the linear sum of the light intensities at a plurality of evaluation positions.

In sub-step R203, the exposure dose is determined. The exposure dose influences the resist information and a latent image pattern formed on a photosensitive agent on a substrate as the object to be exposed.

In step S101, evaluation original data is determined. The evaluation original data includes, for example, the initial arrangement data of an assist pattern. The evaluation original data can include not only the arrangement data but also data concerning, for example, the number, shapes, and sizes of assist patterns, and the transmittance and phase of an original. The following description will be given assuming that the evaluation original data includes the initial arrangement data of an assist pattern.

Because the initial arrangement of an assist pattern is changed in step S102, the initial arrangement itself need not always take account of the imaging performance, and therefore a large amount of calculation is not always necessary in determining the initial arrangement. The initial arrangement of an assist pattern may be the one derived using an interference map proposed by ASML or the one derived by other methods. However, the amount of calculation increases upon determining the initial arrangement using an interference map, so the initial arrangement is desirably determined with a small amount of calculation by employing an empirically known arrangement. An assist pattern derived in accordance with a rule-based system may be selected as the initial assist pattern. In addition, the arrangement of an assist pattern determined in the past using this method may be used as the initial arrangement of an assist pattern.

In case of a line pattern, because a typical empirically known arrangement is known to readily cause shortening of the line, an assist pattern is desirably arranged on, for example, an extension of the line. It is only necessary to store, in the storage unit 40, information required to determine the initial arrangement of an assist pattern, and refer to the stored information in step S101. As is obvious from explanations of Step S102 and embodiments to be given below, the evaluation original pattern preferably does not include the main pattern.

In step S102, the initial arrangement of an assist pattern is changed. Details of the process in step S102 will be described later with reference to FIG. 5.

In the following description, an assist pattern is determined such that the light intensity is relatively high at the intensity evaluation position assuming that the evaluation original pattern does not include the main pattern.

In step S103, it is determined whether assist patterns overlap each other. If YES in step S103, the overlapping assist patterns are combined in step S104. In step S105, it is determined whether the assist pattern integrated by the combination has a size large enough to resolve it on the substrate. This determination can be performed based on geometric information such as the side length and area of the assist pattern.

If YES in step S105, the assist pattern is changed to have a size small enough not to resolve it in step S106. For example, an assist pattern reduced to have a size small enough not to resolve it is preferably arranged in place of the combined assist pattern so as to have the same barycentric position as that of the combined assist pattern (i.e., so as to maintain the barycentric position). The method of changing the assist pattern to have a size small enough not to resolve it is not limited to a reduction in the assist pattern while maintaining the barycentric position.

In step S107, the main pattern is added to the evaluation original pattern.

In step S108, it is determined whether the assist pattern overlaps the main pattern. If YES in step S108, the assist pattern is combined with the main pattern in step S109.

In step S110, original data is generated after a final check. The final check includes, for example, determining whether the original pattern including the main pattern and the assist pattern has a shape that is practically manufacturable as the pattern shape of an original. If the original pattern has a practically unmanufacturable shape, the process returns to step S102 and the calculation can be executed again. Also, in optimization of evaluation original data including only the assist pattern, light beams from the assist pattern and the main pattern sometimes reinforce each other and sometimes weaken each other on the substrate. If these light beams weaken each other, the imaging performance deteriorates. In this case, the phase of the light which passes through the assist pattern need only be almost reversed so that these light beams reinforce each other. The final check in step S110 can also include such a process. Furthermore, if assist patterns do not overlap each other but are adjacent to each other, the assist patterns may be resolved. In step S110, the light intensity on the substrate is calculated, and it is checked whether the assist patterns are not resolved. If the assist patterns are resolved, the process returns to step S102.

Original data is generated after such a final check and stored in the storage unit 40 in a format in which the main pattern and the assist patterns are discriminable.

Figure 4:
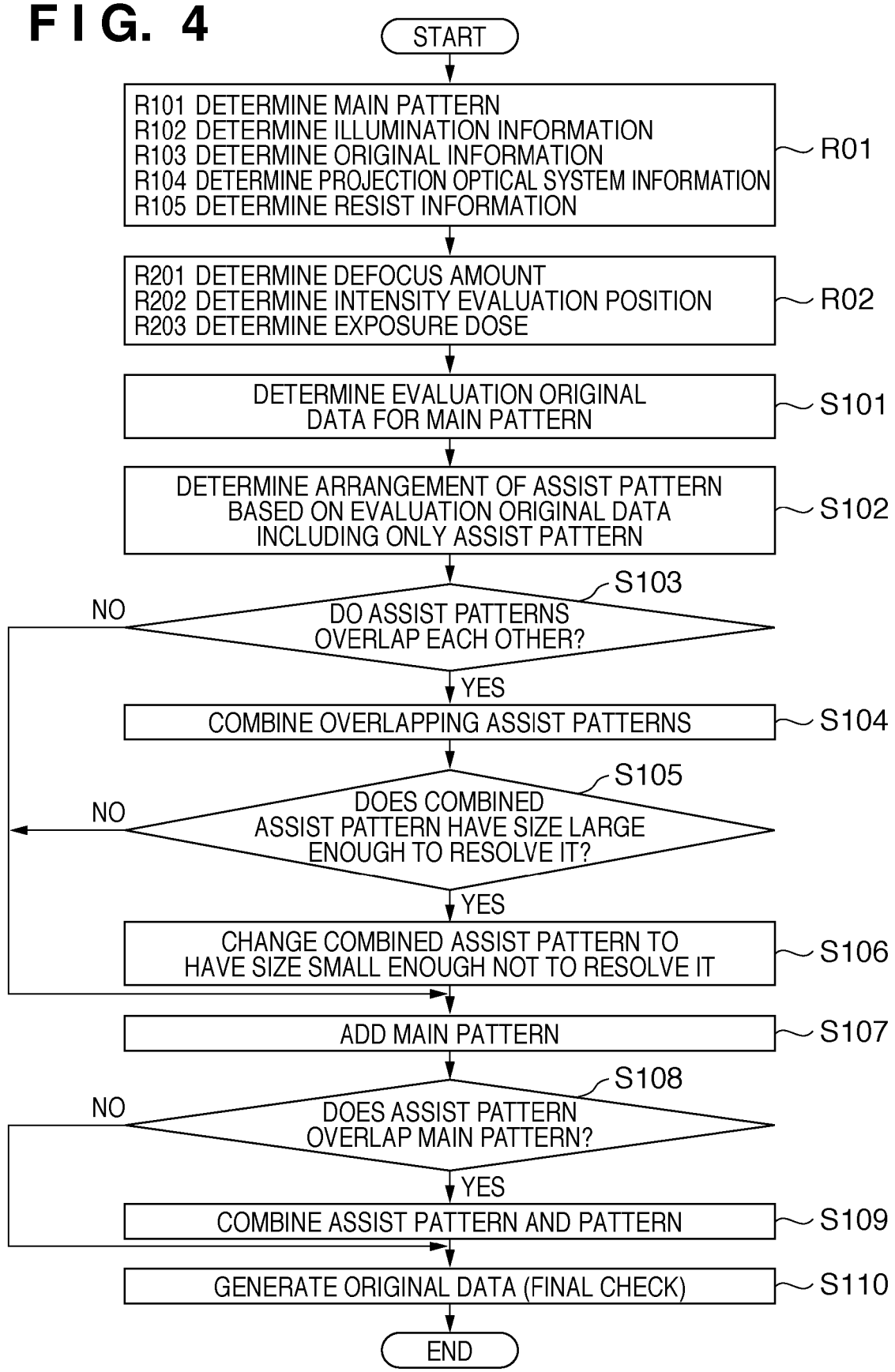
FIG. 4 is a flowchart illustrating more details of the sequence of the original data generation process by the original data generation program.
Figure 5:
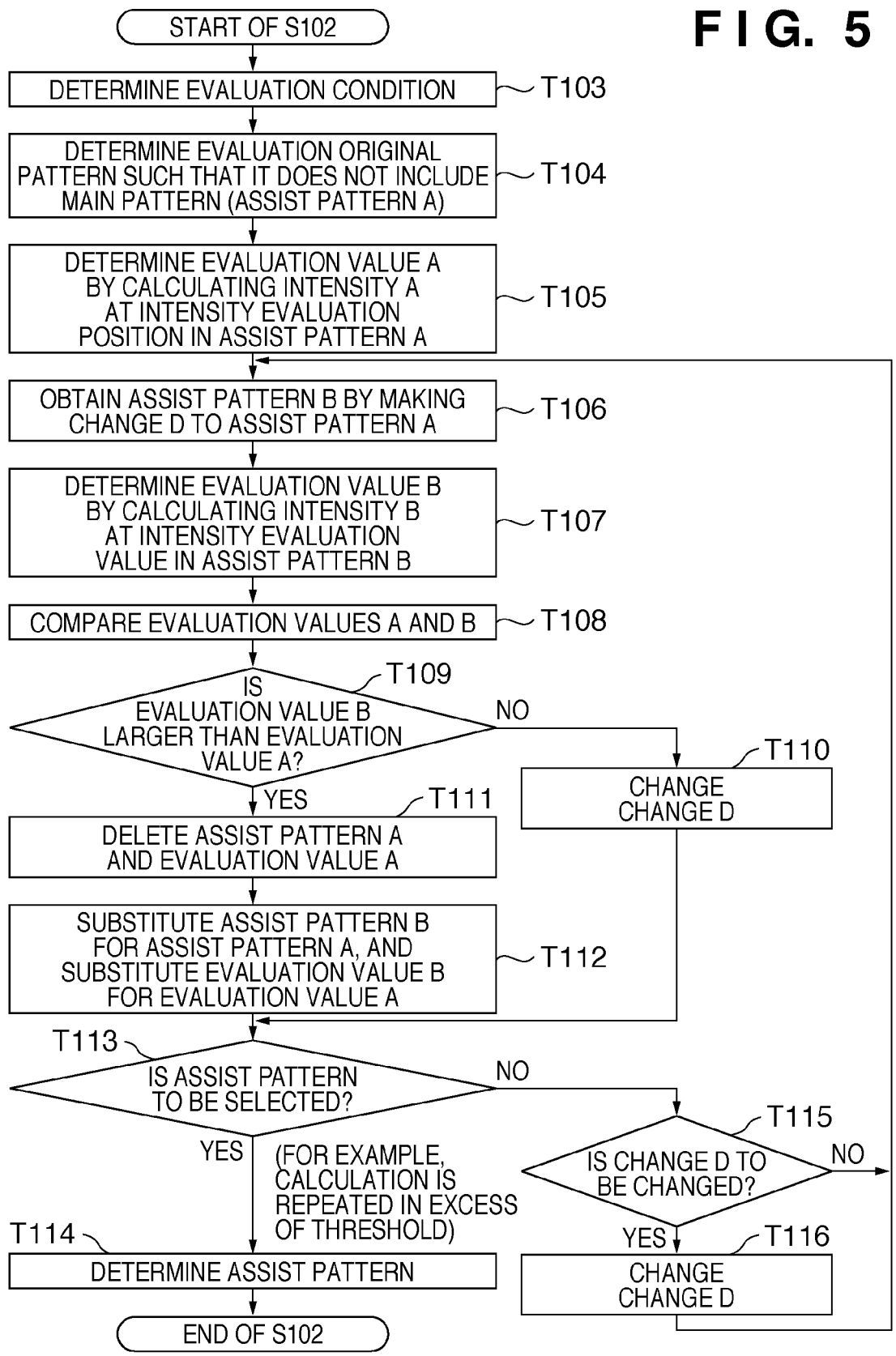
FIG. 5 is a flowchart illustrating details of step S102 in the process illustrated in FIG. 4.

FIG. 5 is a flowchart showing details of step S102 in the process shown in FIG. 4. In step T103, the evaluation condition is determined. The following description will be continued assuming that a condition in which evaluation original data representing that the light intensity at the intensity evaluation position is relatively high is to be selected is determined as the evaluation condition. If there are a plurality of defocus amounts or a plurality of evaluation positions, it is preferable to calculate the light intensities at the respective evaluation positions for the respective defocus amounts, and determine the weighted linear sum of them as the evaluation value. As mentioned above, the weighting factor data and the like can be determined in sub-step R201 or R202. The evaluation value is not limited to the linear sum of the intensities at a plurality of evaluation positions.

In step T104, an evaluation original pattern is determined. The evaluation original pattern does not include the main pattern accompanied by the assist pattern, and only includes the assist pattern. This is because, when the evaluation original pattern does not include the main pattern accompanied by the assist pattern to be determined, the evaluation value more sensitively changes in response to change in the arrangement of the assist pattern. Note that one main pattern is assumed to be evaluated by calculating the light intensity herein. However, the evaluation original pattern may include the main pattern other than that accompanied by the assist pattern to be determined. Moreover, the effect of the present invention never degrades even when the evaluation original pattern includes the main pattern to evaluate. Hence, the evaluation original pattern may include the main pattern. For the sake of descriptive convenience, the evaluation original pattern obtained in step T104 is defined as an assist pattern (first assist pattern (first set of assist pattern)) A.

In step T105, a light intensity A at the evaluation position determined in step R02 in a light intensity distribution (first light intensity distribution) formed at a position matching the defocus amount determined in step R02 is calculated using the assist pattern A. An evaluation value (first evaluation value) A is determined based on the light intensity A. The evaluation value A is assumed to be equal to the light intensity A herein.

In step T106, an assist pattern (second assist pattern) B obtained by making a change D to the assist pattern A is generated. The change D can be a change in the arrangement or size of the assist pattern. The change D may be not only changes in the arrangement and size but also those in, for example, the number, shape, transmittance, and phase. In changing the arrangement of the assist pattern, it is possible to limit a change in the assist pattern in accordance with the symmetries of the effective light source, the main pattern, and the aberration of the projection optical system, thus decreasing the amount of calculation. For example, if the projection optical system has no aberration, the effective light source has centrosymmetry, and the main pattern includes only one contact hole, the position and size of the assist pattern can be changed while maintaining the centrosymmetry. As a matter of course, the present invention is also applicable to a case in which no symmetry is present. Also, if a hollow assist pattern which passes light completely falls within a hollow target pattern which passes light, calculation which makes a change to the main pattern can be omitted.

In step T107, a light intensity (second light intensity) B at the evaluation position determined in step R02 in a light intensity distribution (second light intensity distribution) formed at a position matching the defocus amount determined in step R02 is calculated using the assist pattern B. An evaluation value (second evaluation value) B is determined based on the light intensity B. The evaluation value B is assumed to be equal to the light intensity B herein.

In step T108, the evaluation values A and B are compared. In step T109, the process branches in accordance with the comparison result. If the evaluation value B is larger than the evaluation value A, data on the assist pattern A and the evaluation value A are deleted in step T111. In step T112, the assist pattern B is set as a new assist pattern A, and the evaluation value B is set as a new evaluation value A. That the evaluation value B is larger than the evaluation value A means that the assist pattern B is more excellent than the assist pattern A in an effect of improving the imaging performance of the main pattern.

If it is determined in step T109 that the evaluation value A is larger than the evaluation value B, (for example, the type or amount of) the change D is changed in step T110. Changing the change D makes it possible to prevent the assist pattern B having an evaluation value smaller than that of the assist pattern A from being calculated again. That the evaluation value A is larger than the evaluation B means that the assist pattern A is more excellent than the assist pattern B in an effect of improving the imaging performance of the main pattern.

In step T113, it is determined whether to select the assist pattern A. If YES in step T113, the assist pattern is determined in step T114, and the process in step S102 ends. Whether to select the assist pattern A need only be determined by, for example, determining the number of times of change in the arrangement of an assist pattern in advance, and checking whether the arrangement of the assist pattern has been changed in excess of the predetermined number of times. An assist pattern A obtained by gradually decreasing the amount of change D in the assist pattern to the degree that the amount of change in the evaluation value becomes equal to or smaller than a preset threshold may be selected finally. When a threshold is used, it need only be determined in advance in step R02 or T103. The present invention is not limited to these two methods, and whether to select the assist pattern A may be determined using a general optimization method.

If NO in step T113, it is determined in step T115 whether to change (for example, the type or amount of) the change D. If YES in step T115, the change D is changed in step T116, and the process returns to step T106. With this operation, the processes in step S106 and subsequent steps are executed again. If NO in step T115, the process returns to step T106 without executing step T116. The determination as to whether to change the change D in step T115 is executed assuming, for example, a situation in which when the assist pattern has become too large upon changing its size, the type of change is to be changed from the size to the position so that the size does not increase any more.

An explanation of the process in step S102, which is simplified for the sake of easy understanding, has been given above. In practice, general optimization methods can be used in the respective steps of the process, such as the step of making a change and the step of determining the end of the change.

First Embodiment

In this embodiment, a positive resist is assumed to be used, and a pattern is assumed to be formed in a portion in which the light intensity is equal to or higher than a set threshold. An exposure apparatus which includes a projection optical system having an NA of 0.73, and uses exposure light having a wavelength of 248 nm is assumed to be used. The projection optical system is assumed to have no aberration, and illumination light which illuminates an original is assumed to be non-polarized light. Although a method of calculating the light intensity distribution on the resist near the image plane of the projection optical system is often used, the light intensity distribution is assumed to be calculated as a so-called aerial image which does not take the light intensity distribution on the resist into consideration herein. A case in which so-called aerial image calculation is performed will be expressed as that "the resist is not taken into consideration" hereinafter.

The target pattern is assumed to be an isolated contact hole having a diameter of 120 nm, and the main pattern is assumed to be a pattern (a pattern similar to the target pattern) for forming the target pattern. FIG. 6B is a view exemplifying the main pattern. The effective light source is assumed to have an outer coherency σ of 0.92, an inner coherency σ of 0.72, and an angle of divergence of 30°. FIG. 6A exemplifies the effective light source, and c01 indicates the pupil range of the illumination optical system.

Data handling on a program will be explained with reference to FIG. 4. Information determined in step R01 is that concerning an analysis model. In sub-step R101, information on the main pattern for forming an isolated contact hole having a diameter of 120 nm is determined. In sub-step R102, information designating an outer coherency σ of 0.92, an inner coherency σ of 0.72, an angle of divergence of 30° (see FIG. 6A), non-polarized light, and a wavelength of 248 nm is determined as the illumination condition. In sub-step R103, information designating the use of a binary mask and a pattern which passes light is determined. In sub-step R104, information designating, e.g., the NA, aberration, and magnification of the projection optical system is determined. In this embodiment, the projection optical system has an NA of 0.73, has no aberration, and is non-scaled. In sub-step R105, information designating a positive resist and "the resist is not taken into consideration" is determined.

In step R02, a condition concerning evaluation of the imaging performance is determined. In sub-step R201, the defocus amount is determined to be 0.25 μm. In sub-step R202, the center of the contact hole pattern having a diameter of 120 nm or its vicinity is determined as the light intensity evaluation position. In this embodiment, the resist is not taken into consideration, so the absolute value of the exposure dose need not be taken into consideration. Hence, in sub-step R203, it is determined to evaluate the exposure dose by taking account of only its relative value.

The assist pattern in the initial arrangement determined in step S101 is defined as an assist pattern A. The assist pattern A includes elements dp1, dp2, dp3, dp4, dp5, dp6, dp7, and dp8. The elements dp1, dp2, dp3, and dp4 are congruent with each other. The elements dp5, dp6, dp7, and dp8 are congruent with each other. Each element is a rectangle having long and short side lengths shown in FIG. 7B.

The assist pattern A is the one determined by the conventional method. The position and size of the assist pattern A are changed in step T106 of FIG. 5. The assist pattern A is not always required to attain a high imaging performance. Therefore, an empirically known arrangement may be exploited in determining the assist pattern A.

The assist pattern obtained by the process shown in FIG. 5 is defined as an assist pattern B. The arrangement and sizes of elements of the assist pattern B are shown in FIG. 7B.

In this embodiment, because the projection optical system has no aberration and both the effective light source and the main pattern have 90° rotational symmetry (x-axis and y-axis symmetry), it is effective to change the assist pattern while maintaining 90° rotational symmetry as well. The elements dp1, dp2, dp3, and dp4 shown in FIG. 7A are congruent with each other and have the same distance from the center. The elements dp5, dp6, dp7, and dp8 are congruent with each other and have the same distance from the center. In this arrangement, when dimensions wx1 and wy1 of the element dp1 and a distance d1 of the element dp1 from the center are determined, the arrangement and sizes of the elements dp2, dp3, and dp4 are determined. Also, when dimensions wx2 and wy2 of the element dp5 and a distance d2 of the element dp5 from the center are determined, the arrangement and sizes of the elements dp6, dp7, and dp8 are determined. In the above-mentioned way, an assist pattern is determined by determining the six variables d1, d2, wx1, wy1, wx2, and wy2 of the elements.

For example, three types of changes: increases in the distances d1 and d2 of the elements from the center, keeping of these distances constant, and decreases in these distances are made by the same amount. A pattern which exhibits a highest intensity is selected by comparing nine different patterns eight times. After that, three types of changes: increases in the dimensions wx1, wy1, wx2, and wy2 of the elements, decreases in these dimensions, and keeping of these dimensions constant are made by the same amount, and a pattern which exhibits a highest intensity is selected. An assist pattern which exhibits a higher intensity is then selected by, e.g., changing the amount of change in position and even the amount of change in size. This makes it possible to change the assist pattern while maintaining symmetry. Moreover, an element may be added to the assist pattern in the initial arrangement or removed from it. This embodiment considers a case in which the assist pattern includes eight elements.

FIGS. 8C and 8D show the intensity distributions for a defocus amount of 0.25 µm. Although FIGS. 8C and 8D show the intensity distributions in a section taken along the x-axis, the same applies to those in a section taken along the y-axis because they have 90° rotational symmetry.

In the process shown in FIG. 5, the arrangement and size of the assist pattern are changed so as to increase the intensity value at the evaluation position. An intensity value pb01 (see FIG. 8D) at the evaluation position in the assist pattern B obtained as a result of calculation is higher than an intensity value pa01 (see FIG. 8C) at the evaluation position in the assist pattern A.

This embodiment reveals that the imaging performance actually improves by the effect of an assist pattern. The imaging performance is evaluated based on the CD and the NILS. In the CD-based evaluation, a change in the width of a target pattern in response to a fluctuation in the defocus amount is evaluated. In this embodiment, the diameter of a contact hole changes in response to a fluctuation in the defocus amount. The NILS is a value obtained by multiplying the intensity gradient at a designated position by the width of a target pattern. The intensity gradient at a designated position is often called a log slope. In this embodiment, a value obtained by multiplying the intensity gradient by 0.12 is used as the NILS assuming that the contact hole has a micrometer diameter of 0.12 µm. The CD and the NILS are calculated for a plurality of defocus values based on data on an original pattern including a main pattern. The CD and the NILS are used to explicitly show the effect of this method. Values other than the CD and the NILS may be used as indices for evaluating the effect of this method.

Figure 9A:
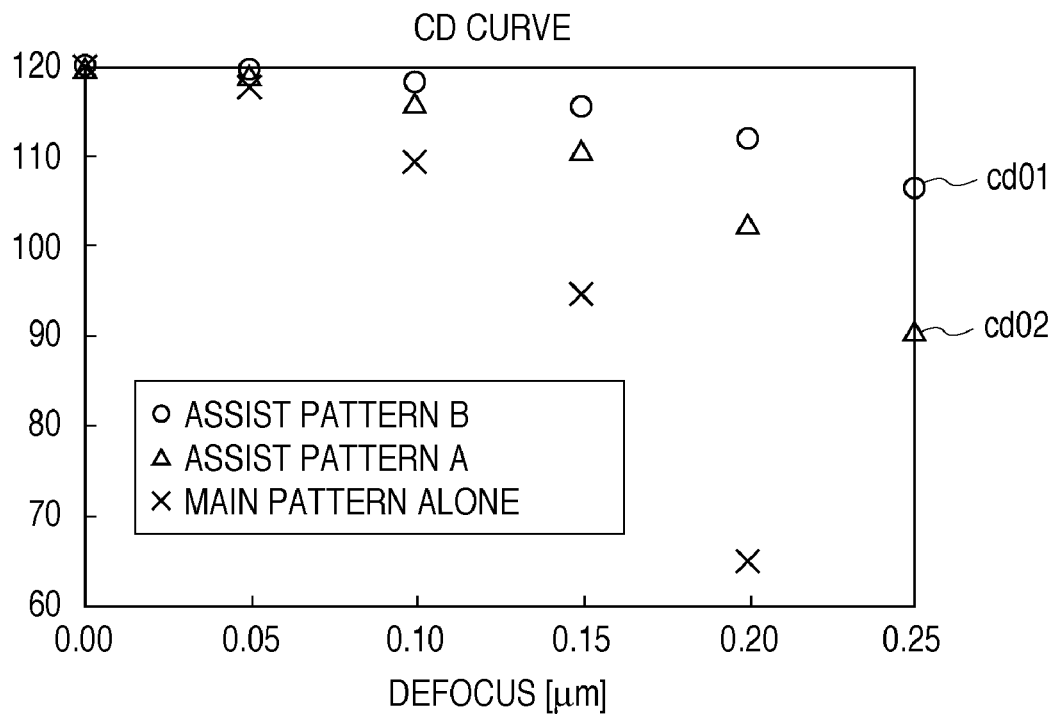
FIGS. 9A and 9B are graphs illustrating the imaging performances.
Figure 9B:
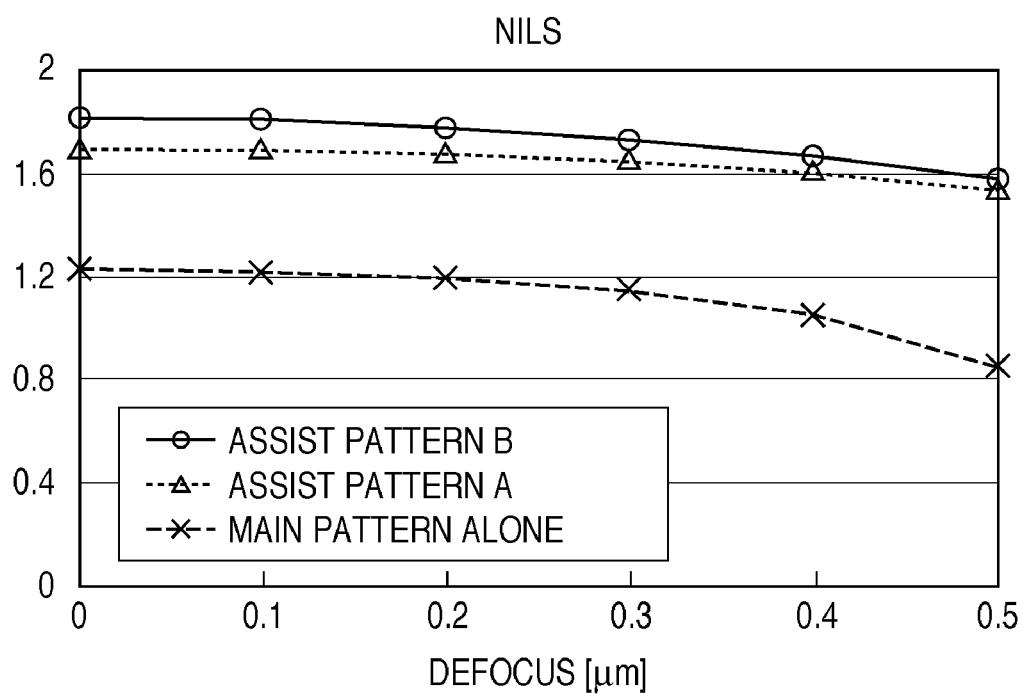

FIGS. 9A and 9B show the fact that the assist pattern B attains a higher imaging performance than the assist pattern A. The CD and the NILS shown in FIGS. 9A and 9B, respectively, are calculated based on data on original patterns shown in FIGS. 12A and 12B (data on original patterns each including a target pattern). This reveals that the assist pattern obtained by the process shown in FIG. 5 has a higher imaging performance than that obtained by the conventional method.

In this embodiment, setting the defocus amount to a certain single value makes it possible to determine an assist pattern with a smaller amount of calculation than in deriving an assist pattern using, e.g., the CD and the NILS as the evaluation values.

Better yet, changing the assist pattern B using the imaging performances (the CD and the NILS) shown in this embodiment as the evaluation values may further improve the imaging performances. This effect can be achieved by inserting, between steps S106 and S107, a step of changing the assist pattern using the imaging performances (the CD and the NILS) as the evaluation values. At this time, minimizing the amount of change in the assist pattern allows a change in the assist pattern as final adjustment. In the present invention, the defocus value to evaluate is not limited to a single value.

Figure 10:
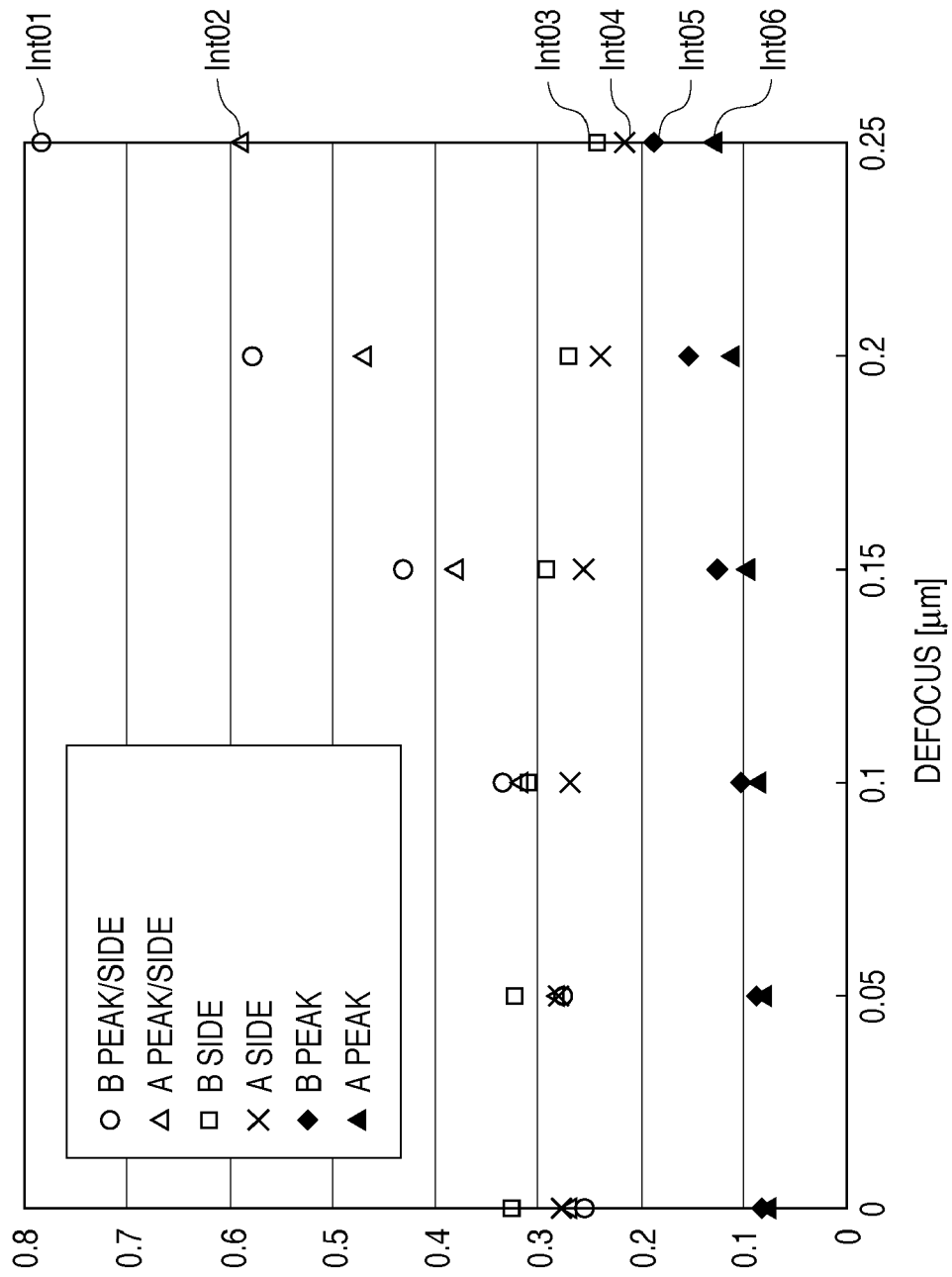
FIG. 10 is a graph illustrating the intensity at an intensity evaluation position.
Figure 11A:
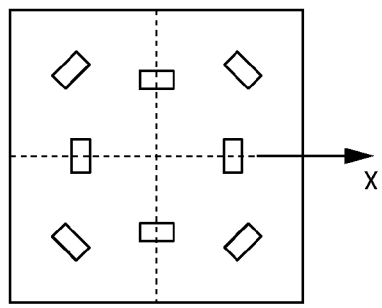
FIGS. 11A to 11F are views illustrating changes in the intensity distributions in response to a change made to the assist pattern.
Figure 11B:
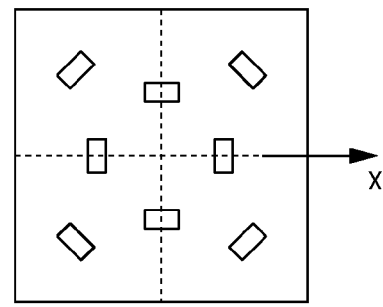
Figure 11C:
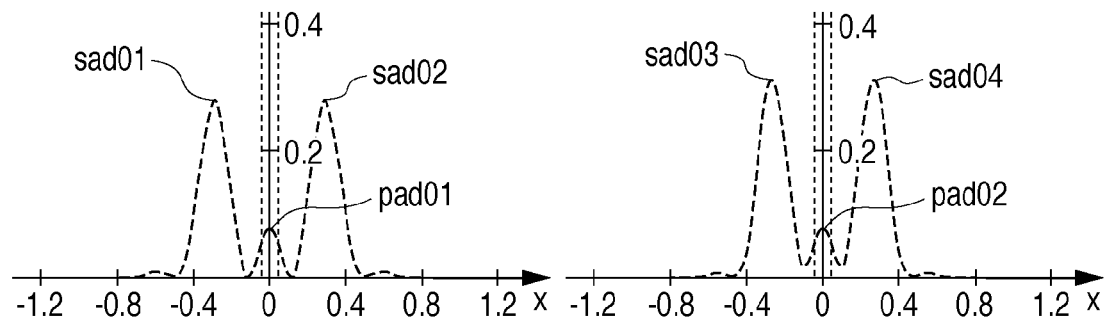
Figure 11D:
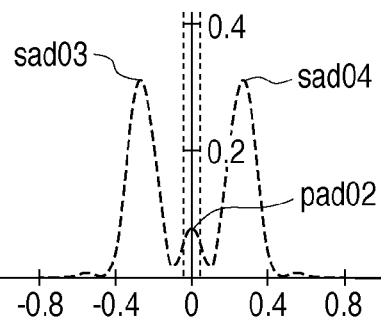
Figure 11E:
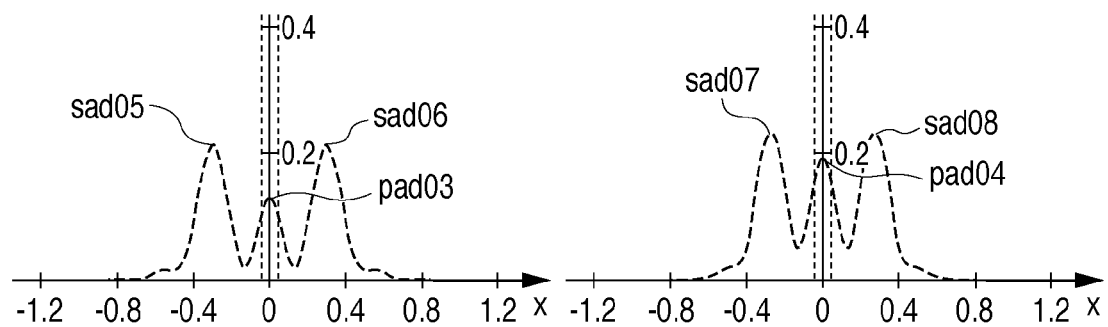
Figure 11F:
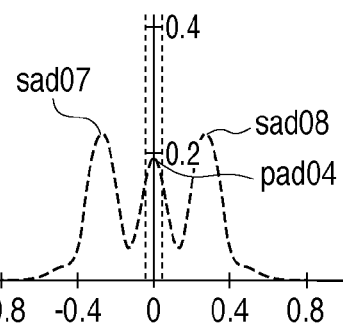

For a defocus amount of 0.25 µm, the line width of the assist pattern B has increased from that of the assist pattern A by about 15% (a comparison between cd01 and cd02 in FIG. 9A). In contrast, referring to FIG. 10, for a defocus amount of 0.25 µm, the intensity value at the evaluation position in the assist pattern B has increased from that of the assist pattern A by about 30% (a comparison between Int05 and Int06). These facts reveal that the intensity value at the evaluation position is more sensitive as the evaluation value than the CD value in changing the arrangement and size of the assist pattern.

Also, a value obtained by dividing the intensity value at the evaluation position by that in a side lobe may be determined as the evaluation value so as to prevent the intensity values in side lobes indicated by psa01 and psa02 in FIG. 8C and psa03 and psa04 in FIG. 8D from becoming too high. At this time, a difference of about 24% occurs between the assist patterns A and B for a defocus amount of 0.25 µm, as can be understood from FIG. 10 (a comparison between Int01 and Int02). Calculating not only the intensity value at the evaluation position but also that in a side lobe makes it possible to prevent the assist pattern from being resolved by itself. A process of, e.g., limiting the size of the assist pattern within a range in which the intensity values in side lobes do not excess a threshold may be added to the original data generation program. Also, the NILS for a specific defocus amount (for example, 0.25 µm) may be selected as the evaluation value.

FIGS. 11C, 11D, 12C, and 12D show the intensity distributions when the defocus amount is zero. FIGS. 11E, 11F, 12E, and 12F show the intensity distributions when the defocus amount is 0.25 µm. The ratio of the difference between pat03 and pat04 in FIGS. 12E and 12F to the intensity value is relatively low. In contrast, the ratio of the difference between pad03 and pad04 in FIGS. 11E and 11F to the intensity value is relatively high. This is because the use of an evaluation original pattern including only an assist pattern makes it possible to more sensitively evaluate the difference between assist patterns without calculating the intensity of light from the main pattern. In general, light from an main pattern has an intensity higher than that from a assist pattern, so an evaluation original pattern including only an assist pattern is preferably used in sensitively evaluating a change in the assist pattern.

In this embodiment, in an evaluation original pattern including only an assist pattern, as the defocus increases, the intensity value at the evaluation position increases. This reveals that the effect of an assist pattern prevents deterioration in the imaging performance of a target pattern along with an increase in the defocus.

According to one aspect of the present invention, an assist pattern having a high capacity to improve the imaging performance against defocusing is determined using an evaluation original pattern including only an assist pattern. For this reason, the defocus to evaluate preferably has a nonzero value that especially receives attention of the user within a practically attainable depth of focus.

Second Embodiment

In this embodiment, a positive resist is assumed to be used, and a pattern is assumed to be formed in a portion in which the light intensity is equal to or higher than a set threshold. An exposure apparatus which includes a projection optical system having an NA of 0.73, and uses exposure light having a wavelength of 248 nm is assumed to be used. The projection optical system is assumed to have no aberration, and illumination light which illuminates an original is assumed to be non-polarized light. The resist is assumed not to be taken into consideration.

The target patterns are assumed to be contact holes which have a diameter of 120 nm and are arranged on the x-axis at a pitch of 360 nm. The main pattern is assumed to be a pattern (a pattern similar to the target pattern) for forming the target pattern (see FIG. 13B). The effective light source is assumed to be dipole illumination having a coherency σ of 0.2 and centers (x, y)=(−0.7, 0) and (0.7, 0), as shown in FIG. 13A. cc01 indicates the pupil range defined by a circle with a radius of 1.

The defocus amount to evaluate is assumed to be 0.25 μm, and the evaluation position is assumed to be the center of each contact hole. In this embodiment, there are three evaluation positions. Handing of each data is the same as in the first embodiment.

An assist pattern includes 16 square patterns having a side length of 80 nm, as shown in FIG. 14A, as elements. Since the assist pattern is symmetrical about the x- and y-axes, it has eight position variables. Although the positions of elements of the assist pattern are changed but the size and the number of elements are constant in this embodiment, variables other than the positions of the elements may be changed.

The assist pattern in the initial arrangement is defined as an assist pattern AA. The assist pattern AA is determined by the conventional method.

The assist pattern obtained by the process shown in FIG. 5 is defined as an assist pattern BB. The assist pattern BB is determined using an evaluation original pattern including only an assist pattern. FIG. 14B shows the arrangements of elements of the assist pattern A and assist pattern BB.

Figure 15A:
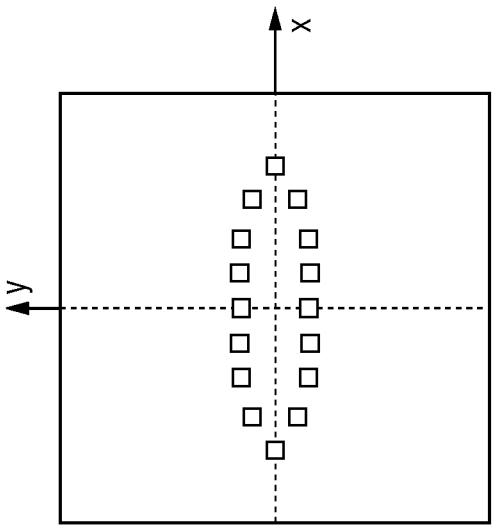
FIGS. 15A to 15D are views illustrating a change in the intensity distribution in response to a change made to the assist pattern.
Figure 15B:
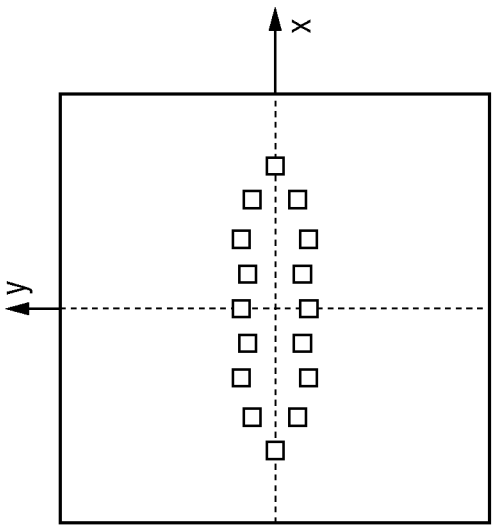
Figure 15C:
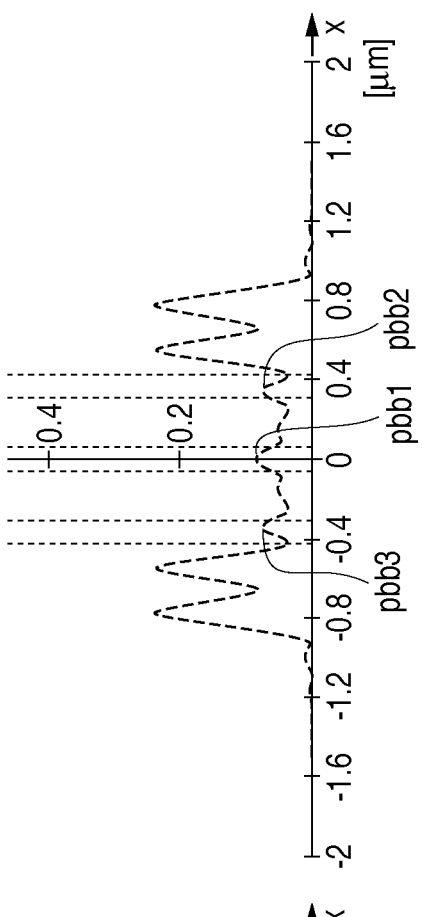
Figure 15D:
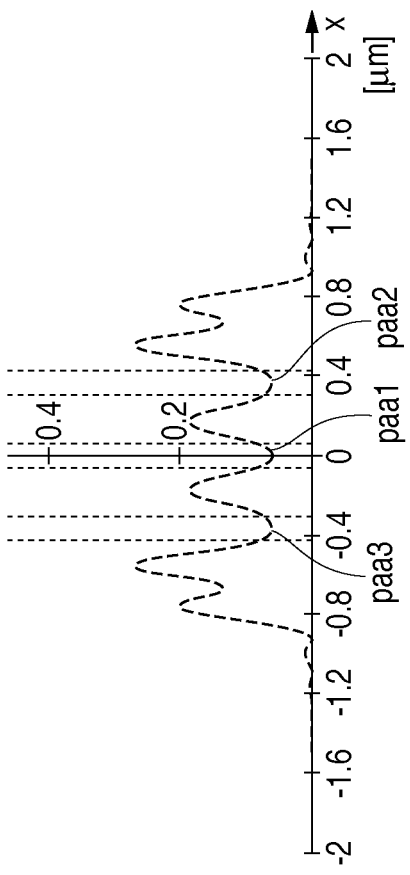

FIGS. 15C and 15D show the intensity distributions on the x-axis on the assist patterns AA and BB. The intensities at the evaluation positions in an intensity distribution formed by the assist pattern AA are paa1, paa2, and paa3. The intensities at the evaluation positions in an intensity distribution formed by the assist pattern BB are pbb1, pbb2, and pbb3. In the conventional method, no intensity peak is formed at the evaluation position. On the other hand, intensity peaks are formed at the evaluation positions in the assist pattern BB by this method. This embodiment reveals that an assist pattern derived by the conventional method does not always form a high intensity at the evaluation position.

Figure 16A:
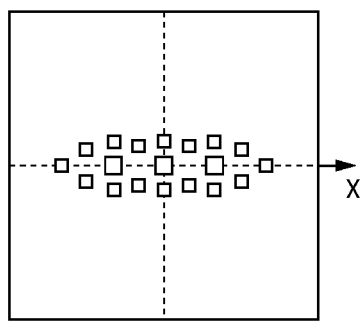
FIGS. 16A to 16F are views illustrating changes in the intensity distributions in response to a change made to the assist pattern.

FIG. 16A shows an original pattern in which the main pattern is added to the assist pattern AA. FIG. 16C shows the light intensity distribution on the image plane obtained assuming that the defocus amount is zero based on the original pattern shown in FIG. 16A. FIG. 16E shows the light intensity distribution on the image plane obtained assuming that the defocus amount is 0.25 μm based on the original pattern shown in FIG. 16A.

Figure 16B:
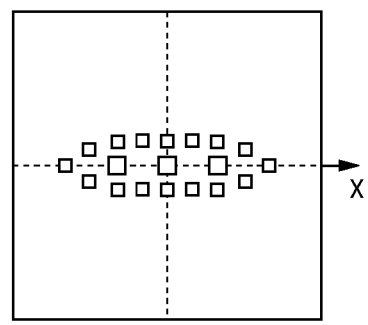
Figure 16C:
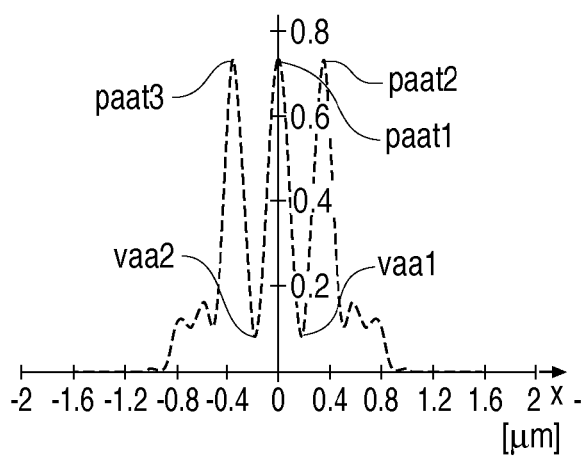
Figure 16D:
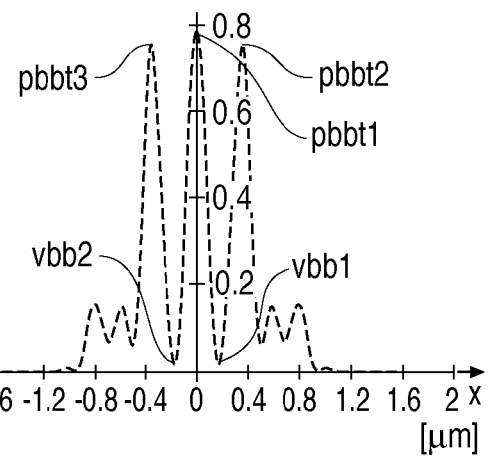
Figure 16E:
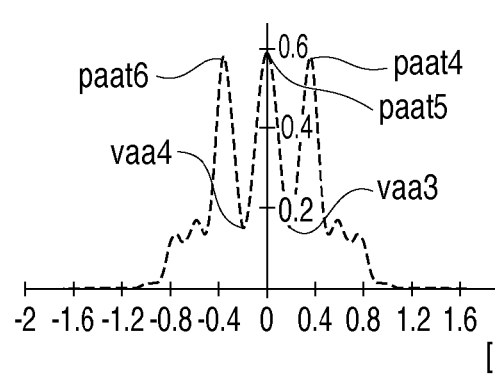
Figure 16F:
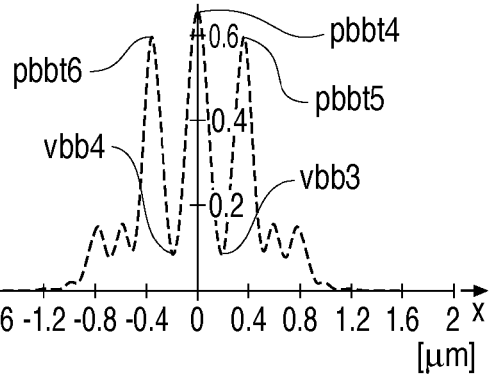

FIG. 16B shows an original pattern in which the main pattern is added to the assist pattern BB. FIG. 16D shows the light intensity distribution on the image plane obtained assuming that the defocus amount is zero based on the original pattern shown in FIG. 16B. FIG. 16F shows the light intensity distribution on the image plane obtained assuming that the defocus amount is 0.25 μm based on the original pattern shown in FIG. 16B. The assist pattern BB has a greater effect of increasing the intensity peaks than the assist pattern AA (a comparison between paat1 to paat6 and pbbt1 to pbbt6), and also has a greater effect of increasing the depths of the intensity valleys (a comparison between vaa1 to vaa6 and vbb1 to vbb6) than the assist pattern AA. The assist pattern BB improves the contrast much greatly than the assist pattern AA.

FIG. 17A is a graph in which the CD on the x-axis is plotted for the central contact hole of three contact holes. FIG. 17B is a graph in which the CD on the y-axis is plotted for the central contact hole of three contact holes. Referring to FIGS. 17A and 17B, the "Assist Pattern AA" corresponds to the original pattern shown in FIG. 16A. Also referring to FIGS. 17A and 17B, the "Assist Pattern BB" corresponds to the original pattern shown in FIG. 16B. Both FIGS. 17A and 17B reveal that the assist pattern BB provides a higher imaging performance than the assist pattern AA.

FIG. 18A is a graph in which the NILS on the x-axis is plotted for the central contact hole of three contact holes. FIG. 18B is a graph in which the NILS on the y-axis is plotted for the central contact hole of three contact holes. Referring to FIGS. 18A and 18B, the "Assist Pattern AA" corresponds to the original pattern shown in FIG. 16A. Also referring to FIGS. 18A and 18B, the "Assist Pattern BB" corresponds to the original pattern shown in FIG. 16B. Both FIGS. 18A and 18B reveal that the assist pattern BB provides a higher imaging performance than the assist pattern AA.

Third Embodiment

In this embodiment, a negative resist is assumed to be used, and a pattern is assumed to be formed in a portion in which the light intensity is equal to or higher than a set threshold. An exposure apparatus which includes a projection optical system having an NA of 0.73, and uses exposure light having a wavelength of 248 nm is assumed to be used. The projection optical system is assumed to have no aberration, and illumination light which illuminates an original is assumed to be non-polarized light. The resist is assumed not to be taken into consideration. The target pattern is assumed to be an isolated line pattern having a dimension of 120 nm in the x-axis direction and a dimension of 2,400 nm in the y-axis direction. The origin is assumed to be the center of the isolated line pattern. The main pattern is assumed to be a pattern (a pattern similar to the target pattern) for forming the target pattern (see FIG. 19B).

Figure 19A:
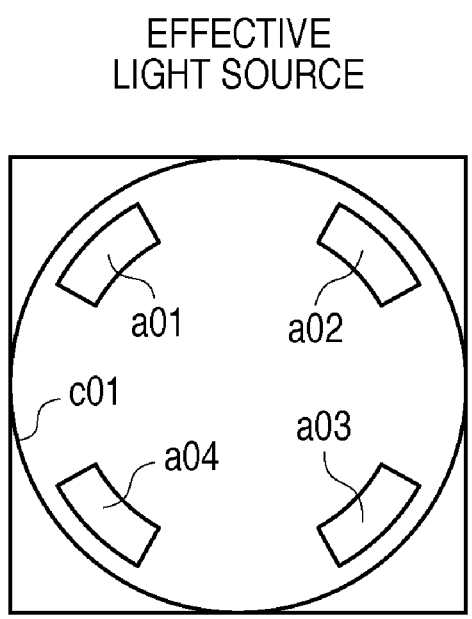
FIGS. 19A and 19B are views exemplifying an effective light source and a main pattern, respectively.

The effective light source is assumed to have an outer coherency σ of 0.92, an inner coherency σ of 0.72, and an angle of divergence of 30°. FIG. 19A exemplifies the effective light source, and c01 indicates the pupil range of the illumination optical system. The defocus amount to evaluate is assumed to be 0.25 μm, and the evaluation position is assumed to be the center of the line pattern. Handing of each data is the same as in the first embodiment.

In this embodiment, the assist pattern is changed so as to decrease the intensity at the evaluation position in correspondence with a pattern which does not pass light.

Data on the assist pattern is assumed to represent that it has a dimension of 50 nm in the x-axis direction and a dimension of 2,400 nm in the y-axis direction. As a matter of course, the size of the assist pattern may be changed. The data on the assist pattern need only be generated with an arrangement symmetrical about the y-axis based on the effective light source and the target pattern. Hence, the center of the assist pattern lies on the x-axis.

An assist pattern AAA has an equidistant arrangement. The central positions of elements daaa1, daaa2, daaa3, and daaa4 shown in FIGS. 20A to 20D are (x, y)=(240, 0), (480, 0), (−240, 0), and (−480, 0), respectively.

An assist pattern BBB is the one obtained by this method. The central positions of elements dbbb1, dbbb2, dbbb3, and dbbb4 shown in FIGS. 20A to 20D are (x, y)=(270, 0), (480, 0), (−270, 0), and (−480, 0). This reveals that the assist pattern BBB has no equidistant arrangement.

FIG. 20C shows the intensity distribution obtained by the assist pattern AAA when the defocus amount is 0.25 μm. FIG. 20D shows the intensity distribution obtained by the assist pattern BBB when the defocus amount is 0.25 μm. An intensity pbbb1 at the evaluation position in the assist pattern BBB is lower than an intensity paaa1 at the evaluation position in the assist pattern AAA.

FIGS. 21C and 21D show the light intensity distributions on the image plane when an original pattern including a main pattern is used, and the defocus amount is 0.25 μm. A comparison between ptaaa1 and ptbbb1 reveals that the ratio of the difference between the assist patterns AAA and BBB to the intensity value is relatively low. An evaluation original pattern including only an assist pattern is more suitable for assist pattern evaluation even when the assist pattern does not pass light.

Figure 22A:
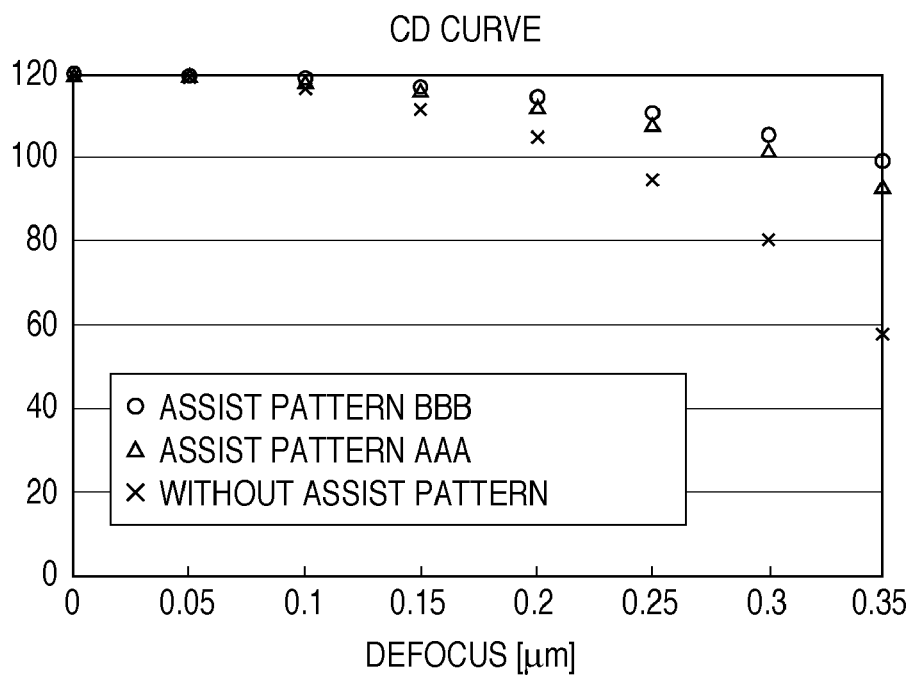
FIGS. 22A and 22B are graphs illustrating the imaging performances of the assist patterns.
Figure 22B:
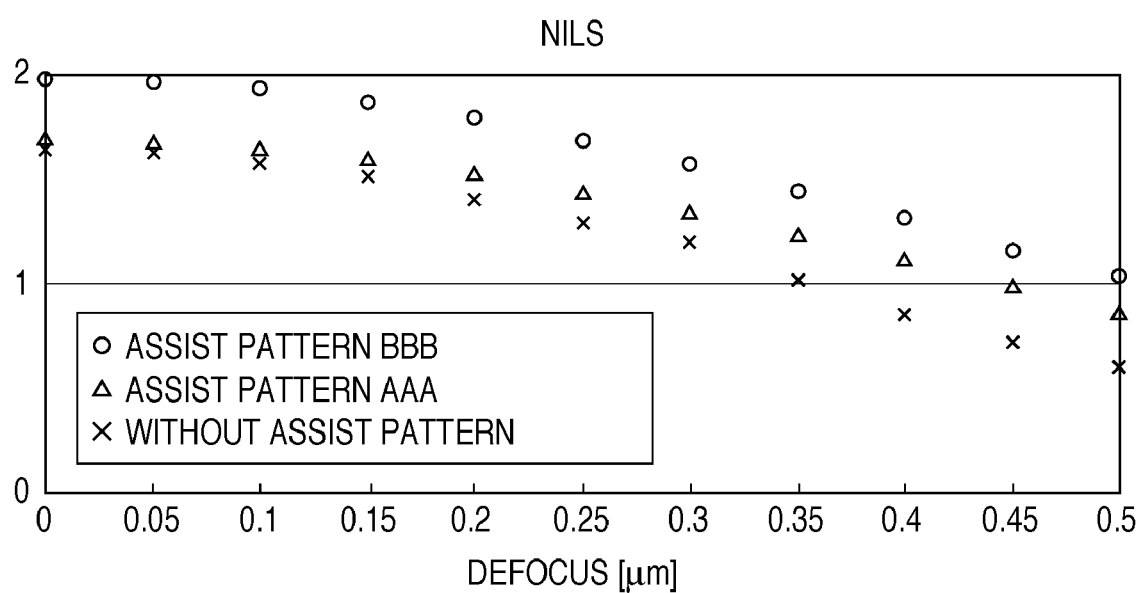

FIG. 22A shows the CD curve in an original pattern including a target pattern. FIG. 22B shows the NILS in an original pattern including a target pattern. Both FIGS. 22A and 22B reveal that the assist pattern BBB provides higher imaging performances than the assist pattern AAA.

Fourth Embodiment

Figure 19B:
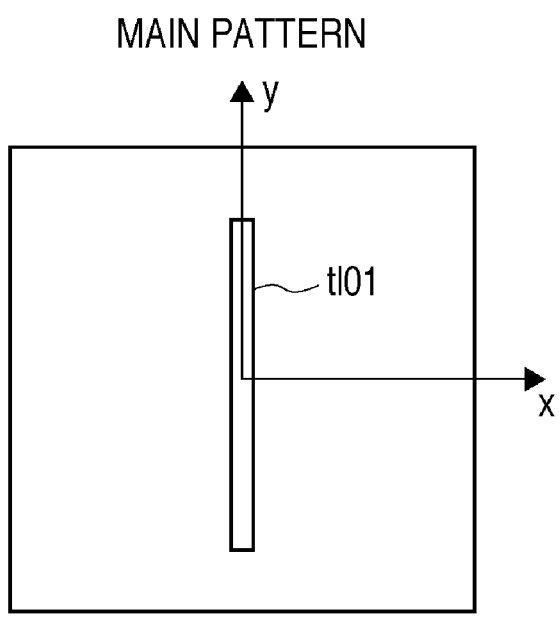

In this embodiment, a negative resist is assumed to be used, and a pattern is assumed to be formed in a portion in which the light intensity is equal to or higher than a set threshold. An exposure apparatus which includes a projection optical system having an NA of 0.73, and uses exposure light having a wavelength of 248 nm is assumed to be used. The projection optical system is assumed to have no aberration, and illumination light which illuminates an original is assumed to be non-polarized light. The resist is assumed not to be taken into consideration. The target pattern is assumed to be an isolated line pattern having a dimension of 120 nm in the x-axis direction and a dimension of 2,400 nm in the y-axis direction. The origin is assumed to be the center of the isolated line pattern. The main pattern is assumed to be a pattern (a pattern similar to the target pattern) for forming the target pattern. FIG. 19B exemplifies the main pattern. The effective light source is assumed to have an outer coherency σ of 0.92, an inner coherency σ of 0.72, and an angle of divergence of 30°. FIG. 19A exemplifies the effective light source, and c01 indicates the pupil range of the illumination optical system.

The defocus amount to evaluate is assumed to be zero. The evaluation position is assumed to be the end of the target pattern in the y-axis direction (short-side portion). Handing of each data is the same as in the first embodiment.

In this embodiment, the assist pattern is changed so as to decrease the intensity at the evaluation position in correspondence with a pattern which does not pass light.

FIGS. 23A, 23C, 23E, and 23G show data concerning the assist pattern BBB shown in the third embodiment. An assist pattern CCC is the one obtained by changing the assist pattern BBB so as to decrease the intensity at the end of the line pattern in the y-axis direction assuming that the evaluation position is the end of the line pattern in the y-axis direction in the assist pattern BBB. In this embodiment, the number of assist patterns changes. The assist pattern CCC is determined by calculation so as to obtain an assist pattern symmetrical about the y-axis. More specifically, the central positions of assist patterns dccc5 and dccc6 change on the y-axis. The assist patterns dccc5 and dccc6 have a dimension of 120 nm in the x-axis direction and a dimension of 50 nm in the y-axis direction. Alternatively, the sizes of the assist patterns dccc5 and dccc6 may be changed.

This embodiment will exemplify a case in which the assist pattern and the main pattern are combined. FIG. 23D shows data in which a main pattern tccc1 is added to the assist pattern CCC shown in FIG. 23B. Note that the assist patterns dccc5 and dccc6 are combined with the main pattern tccc1. FIG. 23F is an enlarged view of the upper portion in FIG. 23D and shows the combination of the patterns. FIG. 23H shows the intensity distribution using contour lines. The intensity at the line end in FIG. 23H is lower than that in FIG. 23G. This reveals that the use of the assist pattern CCC reduces shortening of the line, which is encountered in the use of the assist pattern BBB.

Fifth Embodiment

In this embodiment, a positive resist is assumed to be used, and a pattern is assumed to be formed in a portion in which the light intensity is equal to or higher than a set threshold. An exposure apparatus which includes a projection optical system having an NA of 0.73, and uses exposure light having a wavelength of 248 nm is assumed to be used. The projection optical system is assumed to have no aberration, and illumination light which illuminates an original is assumed to be non-polarized light. The resist is assumed not to be taken into consideration. The target pattern is assumed to be an isolated contact hole having a diameter of 120 nm. The main pattern is assumed to be a pattern (a pattern similar to the target pattern) for forming the target pattern. FIG. 6B exemplifies the main pattern.

A target pattern to be changed based on the evaluation value derived by calculating the intensity is not limited to the assist pattern, and may be the illumination condition.

This embodiment reveals that the imaging performance can improve by changing the illumination information upon determining an assist pattern on an original.

The assist pattern used is the assist pattern B according to the first embodiment. In this embodiment, the shape of the effective light source is changed. To improve the imaging performance by changing the effective light source after determining the assist pattern, it is desirable to finely change the shape and distribution of the effective light source. This is because an assist pattern suited to the illumination condition has already been derived, so a considerable change in the illumination system makes the assist pattern unsuited to the illumination, resulting in deterioration in the imaging performance against expectations. Changing, e.g., the polarization, the effective light source shape, or the light amount distribution as the illumination condition may achieve an improvement in the imaging performance, which cannot be achieved by changing the assist pattern. In this embodiment, it is confirmed that the imaging performance changes by considerably changing the shape of the effective light source, in order to prove that this method holds even for a change in the illumination condition as well as a change in the assist pattern.

Figure 24:
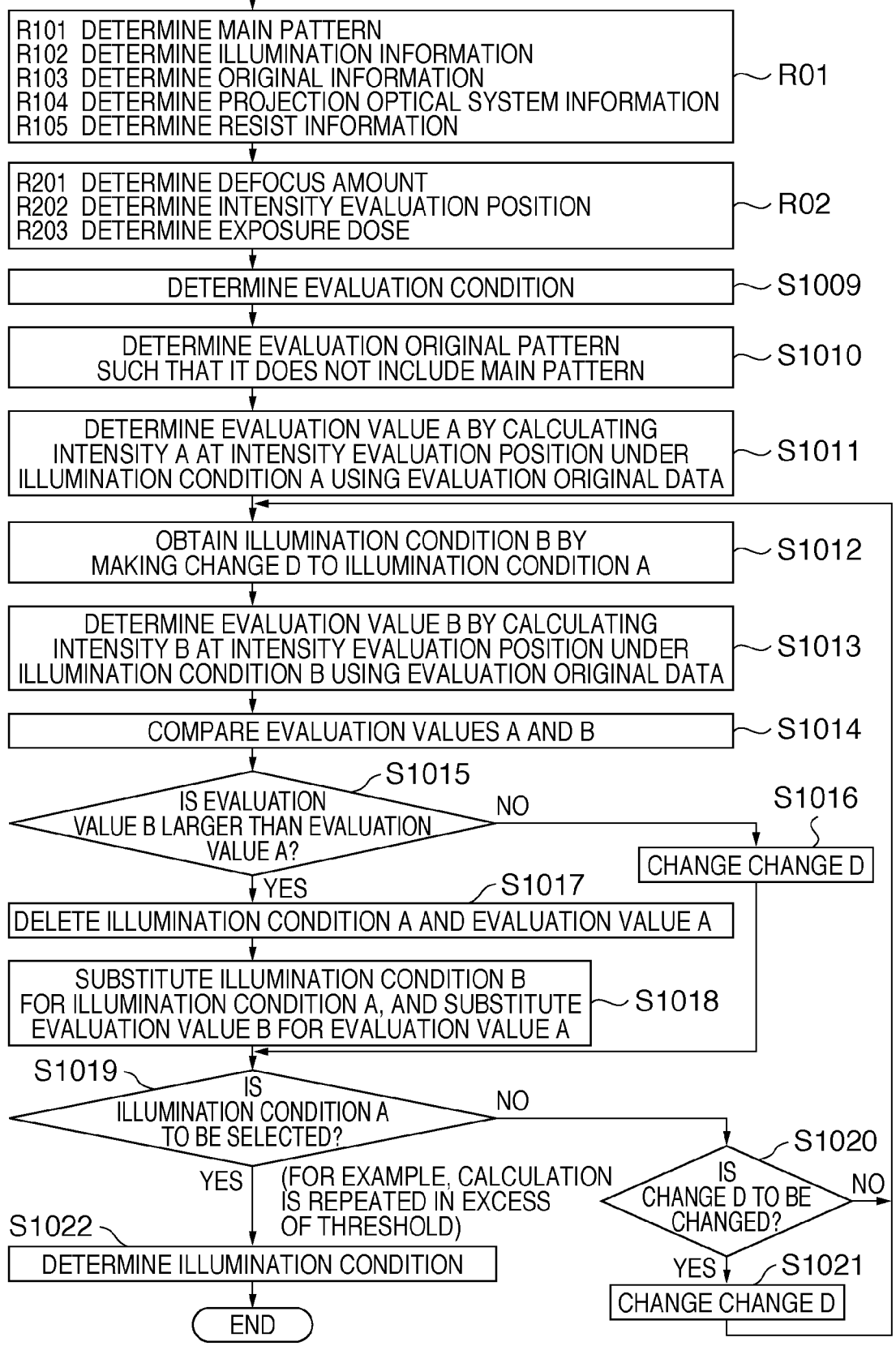
FIG. 24 is a flowchart schematically showing the sequence of an illumination condition determination process by an illumination condition determination program according to a preferred embodiment of the present invention.

An illumination condition determination program will be explained with reference to FIG. 24. This illumination condition determination program can be executed by the computer shown in FIG. 2 as in the above-mentioned original data generation program.

First, the same processes as in steps R01 and R02 in FIG. 4 are executed. In step S1009, the evaluation condition is determined. This process is the same as in step T103 of FIG. 5. In step S1010, the evaluation original pattern is determined. This process is the same as in step T104 of FIG. 5.

In step S1011, a light intensity A at the intensity evaluation position under an illumination condition A is calculated using the evaluation original pattern, and an evaluation value A is determined based on the light intensity A. The illumination condition A is changed in the following steps. The factors of the illumination condition A can include, e.g., the polarization, the effective light source shape, and the light amount distribution. An empirically known condition can be selected as the illumination condition A in accordance with the analysis condition determined in step R01. Also, the illumination condition obtained in step S1022 upon the past calculation may be selected as the illumination condition A.

In step S1012, an illumination condition B is obtained by making a change D to the illumination condition A. The change D is, for example, a change in the polarization, the effective light source shape, or the light amount distribution.

In step S1013, a light intensity B at the intensity evaluation position under the illumination condition B is calculated using the evaluation original pattern, and an evaluation value B is determined based on the light intensity B.

In step S1014, the evaluation values A and B are compared. A case in which the selection of a larger evaluation value is determined as the evaluation condition in step S1009 will be considered hereinafter.

In step S1015 and subsequent steps, an illumination condition under which a larger evaluation value is obtained is selected. Step S1015 and subsequent steps are the same as in step T109 and subsequent steps in FIG. 5. Whether to select the illumination condition A is desirably determined in step S1019 by, for example, determining the number of times of change in the illumination condition in advance. Also, the illumination condition A may be selected when the amount of change in the evaluation value becomes equal to or smaller than a preset threshold upon gradually decreasing the amount of change in the illumination condition. If a threshold is used, it need only be set in step S1007 or S1009 in advance. FIG. 24 shows a sequence simplified for the sake of descriptive convenience. General optimization methods can be used in the respective steps of the sequence, such as the step of making a change and the step of determining the end of the change.

A change in the imaging performance in response to a change in the illumination condition will be explained with reference to FIGS. 25A to 25F. FIG. 25A schematically shows an illumination condition a in which the outer coherency σ is 0.72, the inner coherency σ is 0.56, and the angle of divergence is 30°. FIG. 25B schematically shows an illumination condition b in which the outer σ is 0.92, the inner σ is 0.72, and the angle of divergence is 30°. The illumination condition a is assumed to be used as the initial value. The evaluation original pattern is an assist pattern B (FIGS. 25C and 25D). The evaluation position is assumed to be the center of a contact hole having a diameter of 120 nm. The defocus amount is assumed to be 0.25 μm. The illumination condition b is the result of changing the shape of the effective light source so as to increase the intensity at the evaluation position.

Figure 26A:
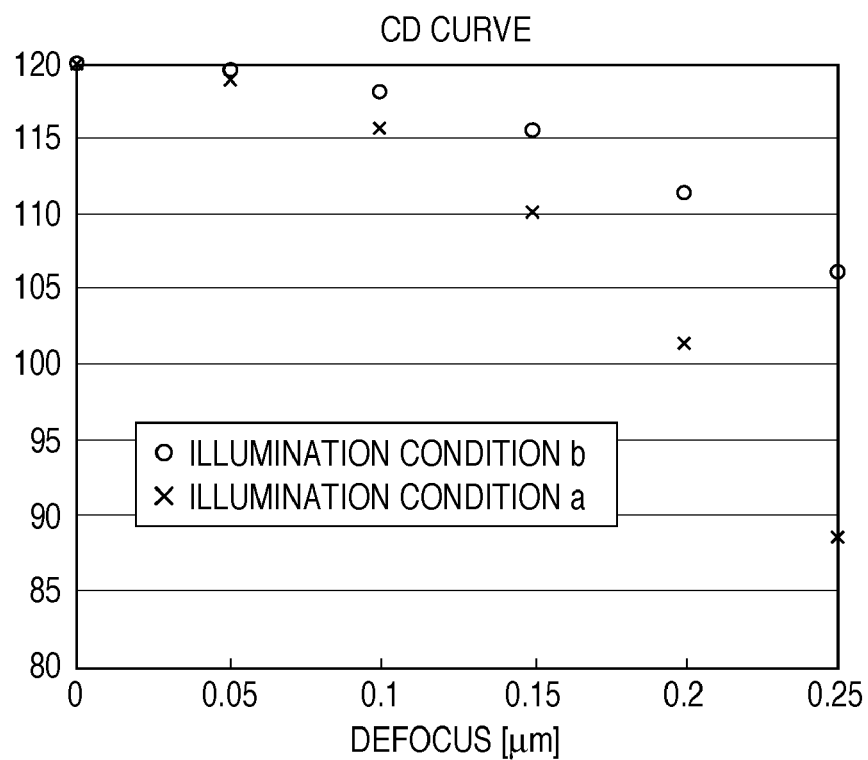
FIGS. 26A and 26B are views illustrating changes in the imaging performances in response to a change in the illumination condition.
Figure 26B:
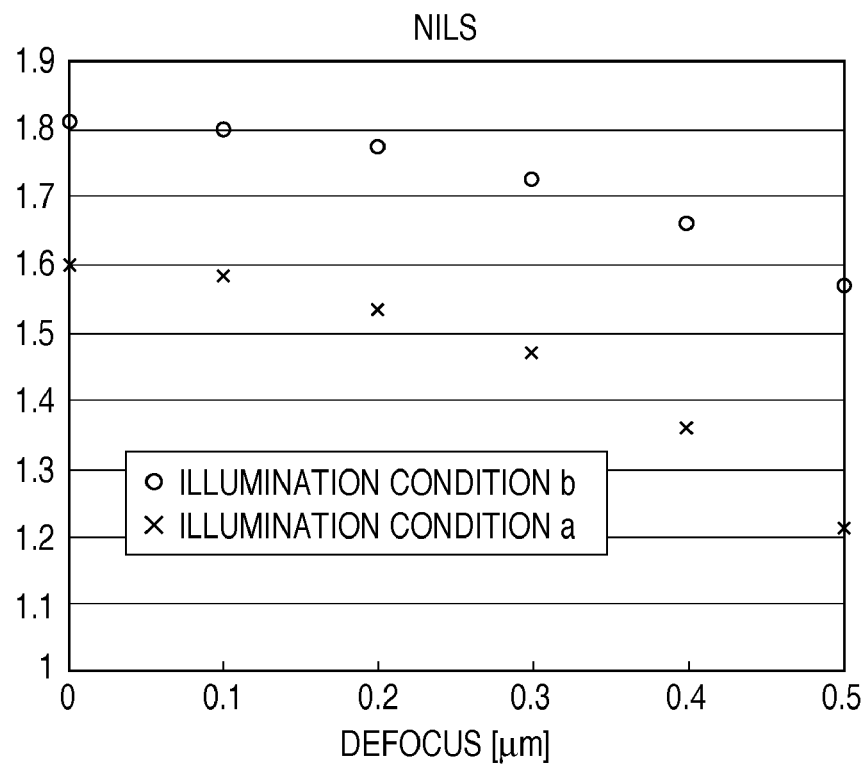

A comparison between FIGS. 25E and 25F reveals that the intensity at the evaluation position under the illumination condition b is higher than that under the illumination condition a. FIGS. 26A and 26B show the CD curve and the NILS, respectively, representing the imaging performances. Both FIGS. 26A and 26B reveal that the illumination condition b provides higher imaging performances than the illumination condition a.

Sixth Embodiment

Figure 28:
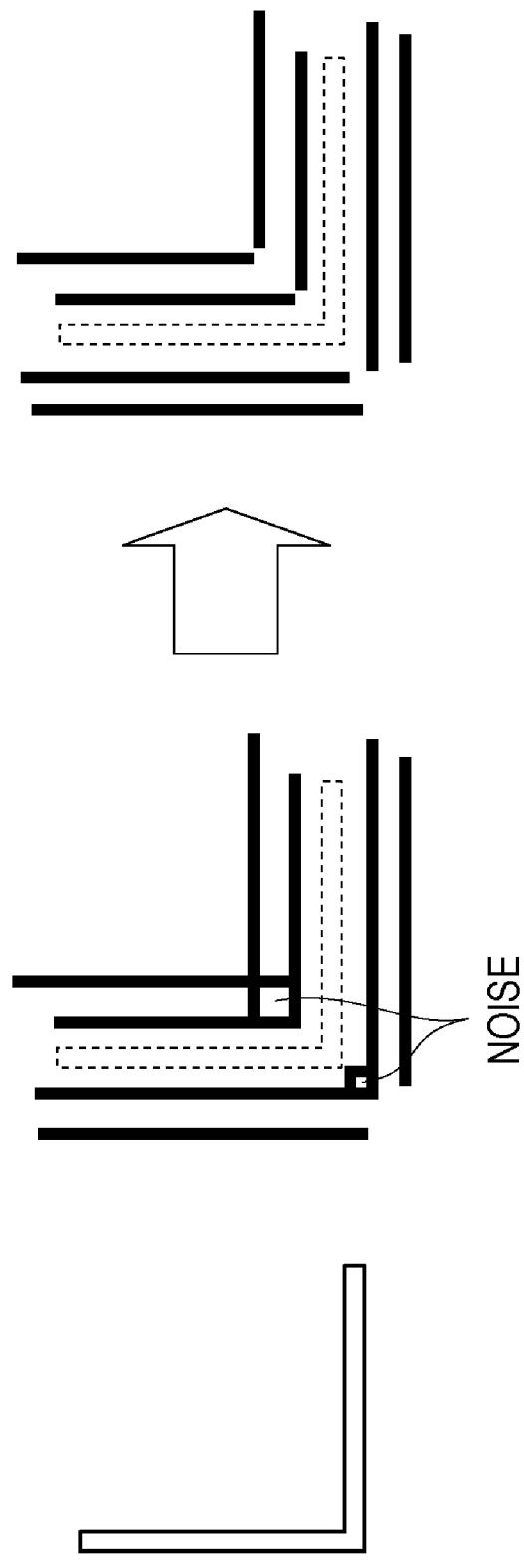
FIG. 28 is a view schematically showing how to obtain a final assist pattern by eliminating any redundant assist patterns (noise).

The use of a mask which does not have a main pattern and has only an assist pattern allows optimization of an evaluation value for estimating the imaging performance such as a light intensity distribution formed at the position of the main pattern or the NILS, thus eliminating any redundant assist patterns (noise). As schematically shown in FIG. 28, it is possible to obtain a final assist pattern eliminating any redundant assist patterns (noise).

It is also possible to estimate the degree of influence of a pattern defect based on a light intensity distribution formed at the position of the main pattern, thus knowing a position especially important in fabricating an original (a position which comes under a large adverse influence of a pattern defect) and a position unimportant in this fabrication. The degree of influence of a defect is the amount of change in the evaluation value such as a light intensity formed at the position of the main pattern upon giving a defect to a light intensity distribution which is formed at the position of the main pattern and calculated in advance when the assist pattern on a mask which does not have a main pattern is free from any defect.

[Exposure Apparatus]

Figure 27:
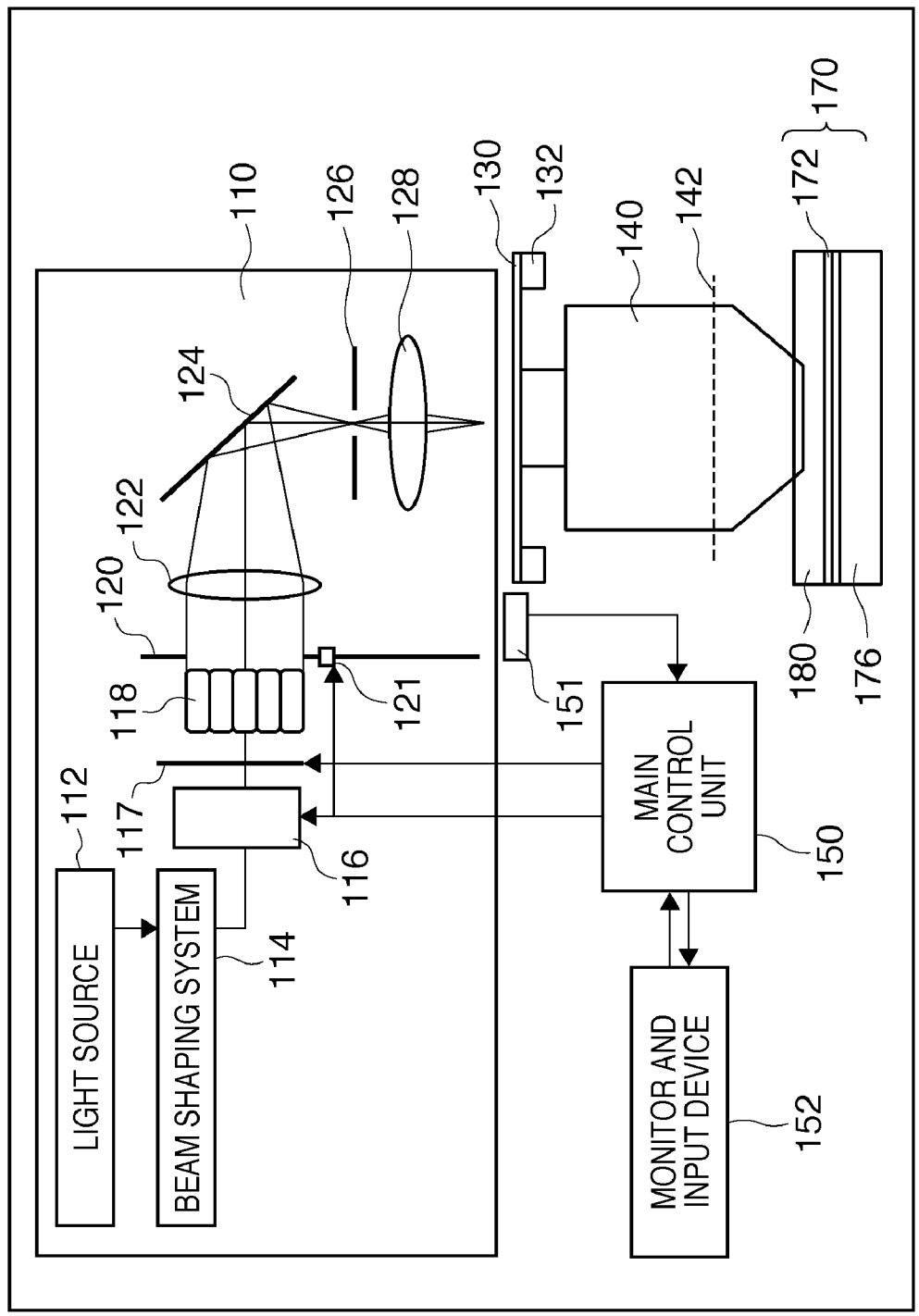
FIG. 27 is a diagram schematically showing the arrangement of an exposure apparatus according to a preferred embodiment of the present invention.

An exposure apparatus which exposes a substrate using an original fabricated based on the original data generated in accordance with the above-mentioned method will be exemplified with reference to FIG. 27. An exposure apparatus 100 includes an illumination device 110, an original stage 132 which holds an original 130, a projection optical system 140, a main control unit 150, a monitor and input device 152, and a substrate stage 176 which holds a substrate 170. The original 130 can be fabricated based on the original data generated in accordance with the above-mentioned method.

The exposure apparatus 100 receives a liquid 180 between the substrate 170 and the final surface of the projection optical system 140, and projects the pattern of the original 130 onto the substrate 170 via the liquid 180, thereby exposing the substrate 170. An exposure apparatus of this type is called an immersion exposure apparatus. The exposure apparatus 100 may be configured as an exposure apparatus using the step & scan scheme, the step & repeat scheme, or another exposure scheme. Also, the exposure apparatus 100 may be an exposure apparatus other than an immersion exposure apparatus.

The illumination device 110 illuminates an original 130 on which an original pattern including a main pattern and assist pattern are formed. The illumination device 110 includes, for example, a light source unit and illumination optical system.

The light source unit includes a laser 112 serving as a light source, and a beam shaping system 114. The laser 112 can use light from a pulsed laser such as an ArF excimer laser having a wavelength of about 193 nm, a KrF excimer laser having a wavelength of about 248 nm, and an $F_2$ excimer laser having a wavelength of about 157 nm. The type of laser and the number of lasers are not limited, and the type of light source unit is not limited, either.

The beam shaping system 114 can be, for example, a beam expander including a plurality of cylindrical lenses. The beam shaping system 114 changes the horizontal to vertical ratio of the sectional shape of collimated light from the laser 112 to a desired value (for example, it changes the sectional shape from a rectangle to a square), thereby shaping the beam into a desired shape. The beam shaping system 114 forms a light beam having a size and an angle of divergence required to illuminate an optical integrator 118 (to be described later).

The illumination optical system illuminates the original 130 with illumination light. The illumination optical system includes, for example, a condensing optical system 116, a polarization control unit 117, the optical integrator 118, an aperture stop 120, a condenser lens 122, a deflecting mirror 124, a masking blade 126, and an imaging lens 128. The illumination optical system can implement not only the conventional illumination but also various types of illumination modes such as modified illuminations as shown in FIGS. 6A and 13A.

The condensing optical system 116 includes a plurality of optical elements and efficiently guides a light beam having a desired shape to the optical integrator 118. The condensing optical system 116 includes, for example, a zoom lens system and controls the shape and angular range of the incident beam on the optical integrator 118.

The condensing optical system 116 includes an exposure dose adjusting unit which can change the exposure dose of illumination light applied to the original 130 for each illumination. The exposure dose adjusting unit is controlled by the main control unit 150. It is also possible to, for example, set an exposure dose monitor between the optical integrator 118 and the original 130 or at another position, measure the exposure dose, and feed back the measurement result.

The polarization control unit 117 includes, for example, a polarizing element and is arranged at a position nearly conjugate to that of a pupil 142 of the projection optical system 140. The polarization control unit 117 controls the polarization state in a predetermined region of an effective light source formed on the pupil 142, as shown in the above embodiments. A polarization control unit 117 including a plurality of types of polarizing elements may be formed in a turret which can be rotated by an actuator (not shown), and the main control unit 150 may control driving of the actuator.

The optical integrator 118 is configured as a fly-eye lens which uniforms illumination light that illuminates the original 130, converts the angular distribution of the incident light into a positional distribution, and outputs the converted light. The fly-eye lens has its incident surface and exit surface which hold the Fourier transform relationship, and is configured by combining a large number of rod lenses (i.e., microlens elements). However, the optical integrator 118 is not limited to a fly-eye lens, and includes, e.g., a plurality of sets of cylindrical lens array plates on which each set of an optical rod and a diffraction grating orthogonal to each other is arranged.

An aperture stop 120 having a fixed shape and diameter is arranged immediately after the exit surface of the optical integrator 118. The aperture stop 120 is arranged at a position nearly conjugate to that of the pupil 142 of the projection optical system 140. The aperture shape of the aperture stop 120 corresponds to the intensity distribution of the effective light source on the pupil of the projection optical system 140. The aperture stop 120 controls the intensity distribution of the effective light source.

The aperture stop 120 can be switchably inserted into the optical path by an aperture exchange mechanism (actuator) 121 in accordance with the illumination condition. Driving of the actuator 121 is controlled by a driving control unit 151 controlled by the main control unit 150. The aperture stop 120 may be integrated with the polarization control unit 117.

The condenser lens 122 converges a plurality of light beams which come from the secondary light sources near the exit surface of the optical integrator 118 and are transmitted through the aperture stop 120, and reflects the converged light by the deflecting mirror 124 to uniformly Kohler-illuminate the surface of the masking blade 126 as the irradiated surface.

The masking blade 126 includes a plurality of movable light-shielding plates, and has a nearly rectangular, arbitrary aperture shape corresponding to the effective area of the projection optical system 140. The light beam transmitted through the aperture of the masking blade 126 is used as illumination light for the original 130. The masking blade 126 is a stop having an automatically variable aperture width, and can change the transfer region. The exposure apparatus 100 may further include a scan blade which has a structure similar to that of the above-mentioned masking blade and can change the transfer region in the scanning direction. The scanning blade is a stop having an automatically variable aperture width as well, and is arranged at a position nearly optically conjugate to that of the surface of the original 130. The exposure apparatus 100 can set the size of the transfer region in accordance with the exposure shot size using these two variable blades.

The imaging lens 128 transfers the aperture shape of the masking blade 126 onto the surface of the original 130 by irradiation, and reduces and projects the pattern on the surface of the original 130 onto the surface of the substrate 170 mounted on a substrate chuck (not shown).

The original 130 has a pattern to be transferred and an assist pattern formed, and is supported and driven by the original stage 132. Diffracted light generated by the original 130 is projected onto the substrate 170 upon passing through the projection optical system 140. The original 130 and the substrate 170 are arranged to hold an optically conjugate relationship. If the exposure apparatus 100 is configured as a scanner (the step & scan scheme), it transfers the pattern of the original 130 onto the substrate 170 by synchronously scanning them. If the exposure apparatus 100 is configured as a stepper (the step & repeat scheme), it performs exposure while the original 130 and the substrate 170 are stationary. The original 130 can be, for example, any one of a binary mask, a halftone mask, or a phase shift mask.

The original stage 132 is driven by a driving mechanism (not shown). The original stage 132 and the projection optical system 140 are arranged on, for example, a stage lens barrel base supported on a base frame, which is mounted on the floor or the like, through, e.g., a damper. The original stage 132 can take any form known to those skilled in the art. The driving mechanism (not shown) includes, e.g., a linear motor and can move the original 130 by driving the original stage 132 in the X and Y directions.

The projection optical system 140 has a function of forming an image of diffracted light passing through the pattern formed on the original 130 onto the substrate 170. The projection optical system 140 can be an optical system including a plurality of lens elements alone, or an optical system (catadioptric system) including a plurality of lens elements and at least one concave mirror. Alternatively, the projection optical system 140 can be, e.g., an optical system including a plurality of lens elements and at least one diffractive optical element such as a kinoform. If correction of chromatic aberration is necessary, a plurality of lenses made of glass materials having different degrees of dispersion (Abbe numbers) are used, or the diffractive optical element is configured so as to cause dispersion in a direction opposite to that of dispersion caused by the lens elements. Otherwise, compensation of chromatic aberration is implemented by narrowing the spectral width of the laser. In recent years, such a narrow-spectrum laser is one of the mainstream exposure light sources.

The main control unit 150 controls driving of each unit and, especially, performs illumination control based on information input from the input device of the monitor and input device 152 and that from the illumination device 110. The control information and other information of the main control unit 150 are displayed on the monitor of the monitor and input device 152.

The substrate 170 is, for example, a wafer or a glass plate and has its surface coated with a photoresist 172.

The substrate 170 is supported by the substrate stage 176. Since the substrate stage 176 can select any form known to those skilled in the art, a description of the detailed arrangement and operation thereof will not be given herein. The substrate stage 176 moves the substrate 170 in the X and Y directions using, for example, a linear motor. The positions of the original stage 132 and substrate stage 176 are monitored by, for example, a laser interferometer. If a scanner is used, it drives the original 130 and the substrate 170 at a predetermined speed ratio. The substrate stage 176 is arranged on, for example, a stage base supported on the floor or the like through a damper. The original stage 132 and the projection optical system 140 are arranged on, for example, a lens barrel base (not shown) supported on a base frame, which is mounted on the floor or the like, through, e.g., a damper.

A substance which has a high transmittance with respect to the exposure wavelength, which never becomes a source of dirt that adheres on the projection optical system 140, and which matches the resist process is selected as the liquid 180. The final surface of the projection optical system 140 is coated with a coating to protect it from the adverse influence of the liquid 180.

In exposure, a light beam emitted by the laser 112 is shaped by the beam shaping system 114, and guided to the optical integrator 118 via the condensing optical system 116. The optical integrator 118 uniforms the illumination light, and the aperture stop 120 sets the intensity distribution of an effective light source as shown in FIG. 6A or 13A. The illumination light illuminates the original 130 under an optimum illumination condition via the condenser lens 122, deflecting mirror 124, masking blade 126, and imaging lens 128. The light beam having passed through the original 130 is reduced and projected onto the substrate 170 by the projection optical system 140 at a predetermined magnification.

Because the final surface of the projection optical system 140, which directly faces the substrate 170, is immersed in a liquid 180 having a refractive index higher than that of air, the NA of the projection optical system 140 is so high as to attain a resolution high enough to form a sufficiently fine pattern on the substrate 170. In addition, a high-contrast image is formed on the photoresist 172 by polarization control. Hence, the exposure apparatus 100 accurately transfers the pattern onto the resist to provide high-quality devices (e.g., a semiconductor element, an LCD element, an image sensing device (e.g., a CCD), and a thin-film magnetic head).

[Device Manufacturing Method]

A device manufacturing method according to a preferred embodiment of the present invention is suitable for manufacturing, for example, a semiconductor device and a liquid crystal device. The method can include a step of transferring the pattern of an original onto a photosensitive agent applied on a substrate using the above-described exposure apparatus, and a step of developing the photosensitive agent. The devices are manufactured by further other known steps (e.g., etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-102559, filed Apr. 10, 2008, which is hereby incorporated by reference herein in its entirety.

What is claimed is:

1. A device manufacturing method comprising the steps of:
generating data on an original pattern;
fabricating an original based on the generated data on the original pattern;
exposing a substrate with an exposure apparatus using the original; and
developing the substrate,
wherein the generating step generates the data on the original pattern used in the exposure apparatus which projects the original pattern onto a substrate via a projection optical system to form an image of a target pattern on the substrate, and comprises:
a determination step of determining a final assist pattern based on a light intensity distribution formed by the projection optical system when, of a main pattern and an assist pattern to accompany the main pattern which form the original pattern, only the assist pattern is inserted in an object plane of the projection optical system; and
a combining step of combining the final assist pattern and the main pattern to generate data on the original pattern,
wherein in the determination step, the final assist pattern is determined by repeating a process of calculating and evaluating the light intensity distribution while changing the assist pattern to be inserted in the object plane of the projection optical system, and a process of changing the assist pattern to be inserted in the object plane of the projection optical system.

2. A device manufacturing method comprising the steps of:
determining an illumination condition;
exposing a substrate with an exposure apparatus while illuminating an original under the determined illumination condition; and
developing the substrate,
wherein the determining step determines an illumination condition under which an original pattern is illuminated in the exposure apparatus which projects the original pattern onto a substrate via a projection optical system to form an image of a target pattern on the substrate, the method comprising
a determination step of determining a final illumination condition based on a light intensity distribution formed by the projection optical system when, of a main pattern and an assist pattern accompanying the main pattern which form the original pattern, only the assist pattern is inserted in an object plane of the projection optical system,
wherein in the determination step, the final illumination condition is determined by repeating a process of calculating and evaluating the light intensity distribution, and a process of changing the illumination condition.

3. An original data generation method of generating data on an original pattern used in an exposure apparatus which projects the original pattern onto a substrate via a projection optical system to form an image of a target pattern on the substrate, the method comprising:
a determination step of determining a final assist pattern based on a light intensity distribution formed by the projection optical system when, of a main pattern and an assist pattern to accompany the main pattern which form the original pattern, only the assist pattern is inserted in an object plane of the projection optical system; and
a combining step of combining the final assist pattern and the main pattern to generate data on the original pattern,
wherein in the determination step, the final assist pattern is determined by repeating a process of calculating and evaluating the light intensity distribution while changing the assist pattern to be inserted in the object plane of the projection optical system, and a process of changing the assist pattern to be inserted in the object plane of the projection optical system.

4. A memory medium storing an original data generation program for generating data on an original pattern used in an exposure apparatus which projects the original pattern onto a substrate via a projection optical system to form an image of a target pattern on the substrate, the program comprising:
a determination step of determining a final assist pattern based on a light intensity distribution formed by the projection optical system when, of a main pattern and an assist pattern to accompany the main pattern which form the original pattern, only the assist pattern is inserted in an object plane of the projection optical system; and a combining step of combining the final assist pattern and the main pattern to generate data on the original pattern, wherein in the determination step, the final assist pattern is determined by repeating a process of calculating and evaluating the light intensity distribution, and a process of changing the assist pattern to be inserted in the object plane of the projection optical system.

5. The medium according to claim 1, wherein in the determination step, a first step of obtaining a first evaluation value by evaluating a first light intensity distribution formed by the projection optical system when a first assist pattern is inserted in the object plane of the projection optical system, a second step of obtaining a second evaluation value by evaluating a second light intensity distribution formed by the projection optical system when a second assist pattern is inserted in the object plane of the projection optical system, and a step of comparing the first evaluation value and the second evaluation value, and, if the first evaluation value is better than the second evaluation value, making a change to the first assist pattern to generate a new second assist pattern, and executing the second step for the new second assist pattern again, and, if the second evaluation value is better than the first evaluation value, setting the second assist pattern and the second evaluation value as a new first assist pattern and a new first evaluation value, respectively, making a change to the new first assist pattern to generate a new second assist pattern, and executing the second step for the new second assist pattern again are executed repeatedly.

6. The medium according to claim 1, wherein in the determination step, the final assist pattern is determined based on a light intensity distribution formed by the projection optical system when a main pattern different from the main pattern to be accompanied by the assist pattern to be determined in the determination step is inserted in the object plane of the projection optical system, together with the assist pattern.

7. The medium according to claim 1, wherein if the main pattern includes a hole pattern, the final assist pattern is determined based on a light intensity distribution formed at the center of the hole pattern or in the vicinity of the center of the hole pattern in the determination step.

8. The medium according to claim 1, wherein if the main pattern includes a line pattern, the final assist pattern is determined based on a light intensity distribution formed in a short-side portion of the line pattern in the determination step.

9. The medium according to claim 1, wherein in the determination step, the final assist pattern is determined based on a light intensity distribution at a position misaligned from an image plane of the projection optical system.

10. An illumination condition determination method of determining an illumination condition under which an original pattern is illuminated in an exposure apparatus which projects the original pattern onto a substrate via a projection optical system to form an image of a target pattern on the substrate, the method comprising a determination step of determining a final illumination condition based on a light intensity distribution formed by the projection optical system when, of a main pattern and an assist pattern accompanying the main pattern which form the original pattern, only the assist pattern is inserted in an object plane of the projection optical system, wherein in the determination step, the final illumination condition is determined by repeating a process of calculating and evaluating the light intensity distribution, and a process of changing the illumination condition.

11. A memory medium storing an illumination condition determination program for determining an illumination condition under which an original pattern is illuminated in an exposure apparatus which projects the original pattern onto a substrate via a projection optical system to form an image of a target pattern on the substrate, the program comprising a determination step of determining a final illumination condition based on a light intensity distribution formed by the projection optical system when, of a main pattern and an assist pattern accompanying the main pattern which form the original pattern, only the assist pattern is inserted in an object plane of the projection optical system, wherein in the determination step, the final illumination condition is determined by repeating a process of calculating and evaluating the light intensity distribution, and a process of changing the illumination condition.

* * * * *